(12) United States Patent
Choi et al.

(10) Patent No.: US 11,742,470 B2
(45) Date of Patent: Aug. 29, 2023

(54) DISPLAY DEVICE AND METHOD OF MANUFACTURING THE SAME

(71) Applicant: SAMSUNG DISPLAY CO., LTD., Yongin-si (KR)

(72) Inventors: Jinwoo Choi, Yongin-si (KR); Minwoo Kim, Yongin-si (KR); Daeho Song, Yongin-si (KR); Byungchoon Yang, Yongin-si (KR); Hyungil Jeon, Yongin-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 257 days.

(21) Appl. No.: 17/116,221

(22) Filed: Dec. 9, 2020

(65) Prior Publication Data

US 2021/0193893 A1 Jun. 24, 2021

(30) Foreign Application Priority Data

Dec. 23, 2019 (KR) .......................... 10-2019-0173463

(51) Int. Cl.
*H01L 33/62* (2010.01)
*H01L 33/48* (2010.01)
(Continued)

(52) U.S. Cl.
CPC ............ *H01L 33/62* (2013.01); *H01L 33/005* (2013.01); *H01L 33/42* (2013.01); *H01L 33/486* (2013.01);
(Continued)

(58) Field of Classification Search
CPC ....... H01L 33/62; H01L 33/005; H01L 33/42; H01L 33/486; H01L 2933/0016; H01L 2933/0066
See application file for complete search history.

(56) References Cited

U.S. PATENT DOCUMENTS 9,966,553 B2    5/2018   Choi et al.
10,020,422 B1 * 7/2018   Oyer ..................... H01L 25/167
10,062,675 B2   8/2018   Chang et al.
(Continued)

FOREIGN PATENT DOCUMENTS

KR   10-2017-0094930    8/2017
KR   10-2017-0109718    10/2017
(Continued)

*Primary Examiner* — Feifei Yeung Lopez
(74) *Attorney, Agent, or Firm* — F. Chau & Associates, LLC

(57) ABSTRACT

A display device including at least one emission area emitting light and a transmission area adjacent to the at least one emission area and transmitting external light. The display device includes a substrate and a circuit element including at least one transistor and a storage capacitor disposed on the substrate. An insulating layer is disposed on the circuit element and includes a contact hole. A first transparent electrode is disposed on the insulating layer and is electrically connected to the circuit element through the contact hole. At least one light-emitting diode is disposed on the first transparent electrode and defines the at least one emission area. The at least one light-emitting diode comprises a PN diode including inorganic semiconductor based-materials. A portion of the first transparent electrode is located in the transmission area.

23 Claims, 19 Drawing Sheets

(51) Int. Cl.
  *H01L 33/00* (2010.01)
  *H01L 33/42* (2010.01)
(52) U.S. Cl.
  CPC ............. *H01L 2933/0016* (2013.01); *H01L 2933/0066* (2013.01)

(56) References Cited

U.S. PATENT DOCUMENTS

| | | |
|---|---|---|
| 10,115,767 B2 | 10/2018 | Kwon |
| 10,128,308 B1 | 11/2018 | Shin et al. |
| 10,338,712 B2 | 7/2019 | Bok et al. |
| 10,373,985 B2 | 8/2019 | Kim et al. |
| 2009/0039360 A1* | 2/2009 | Cok ................. H05B 33/10 257/89 |
| 2011/0163661 A1* | 7/2011 | Lee ................. H01L 27/3227 313/504 |
| 2012/0074435 A1* | 3/2012 | Ha ................. H01L 27/3209 257/E33.012 |
| 2014/0225102 A1* | 8/2014 | Ikeda ................. H01L 51/5225 257/43 |
| 2014/0367651 A1* | 12/2014 | Song ................. H01L 51/5221 257/40 |
| 2016/0372514 A1* | 12/2016 | Chang ................. G09G 3/2003 |
| 2019/0229247 A1* | 7/2019 | Taka ................. H01L 33/641 |

FOREIGN PATENT DOCUMENTS

| | | |
|---|---|---|
| KR | 10-2017-0116631 | 10/2017 |
| KR | 10-2017-0117282 | 10/2017 |
| KR | 10-2018-0009116 | 1/2018 |
| KR | 10-2018-0032715 | 4/2018 |
| KR | 10-2018-0119273 | 11/2018 |
| KR | 10-2019-0076929 | 7/2019 |

* cited by examiner

DISPLAY DEVICE AND METHOD OF MANUFACTURING THE SAME

CROSS-REFERENCE TO RELATED APPLICATION

This application claims priority under 35 U.S.C. § 119 to Korean Patent Application No. 10-2019-0173463, filed on Dec. 23, 2019 in the Korean Intellectual Property Office, the disclosure of which is incorporated by reference in its entirety herein.

1. TECHNICAL FIELD

One or more exemplary embodiments of the present inventive concepts relate to a display device, and more particularly, to a light-emitting display device including a region through which external light may pass, and a method of manufacturing the light-emitting display device.

2. DISCUSSION OF RELATED ART

Among display devices that display an image, a light-emitting diode display device has a self-luminous characteristic in contrast with a liquid crystal display device. Therefore, a light-emitting diode display device does not require a separate light source which results in a reduction in the thickness and weight of the display device. In addition, a light-emitting diode display device may have high-quality characteristics, such as low power consumption, high brightness, and fast response speeds.

A light-emitting diode display device may have different shapes based on the various purposes of the display device and the various shapes of electronic apparatuses that include the display device.

SUMMARY

In an exemplary embodiment of the present inventive concepts, a display device may include a transparent display device that may display an image by using light-emitting diodes in a display area and/or display an external image (e.g., an image of an external object) that passes through the display area. However, a sufficient transmission area should be provided to display an external image by using the transparent display device.

One or more exemplary embodiments of the present inventive concepts include a light-emitting display device that may secure a sufficient transmission area. However, it should be understood that exemplary embodiments of the present inventive concepts described herein should be considered in a descriptive sense only and not for limitation of the disclosure.

Additional aspects will be set forth in part in the description which follows and, in part, will be apparent from the description, or may be learned by practice of the presented embodiments of the disclosure.

According to an exemplary embodiment of the present inventive concepts, a display device includes at least one emission area emitting light and a transmission area adjacent to the at least one emission area and transmitting external light. The display device includes a substrate and a circuit element including at least one transistor and a storage capacitor disposed on the substrate. An insulating layer is disposed on the circuit element and includes a contact hole. A first transparent electrode is disposed on the insulating layer and is electrically connected to the circuit element through the contact hole. At least one light-emitting diode is disposed on the first transparent electrode and defines the at least one emission area. The at least one light-emitting diode comprises a PN diode including inorganic semiconductor based-materials. A portion of the first transparent electrode is located in the transmission area.

The display device may further include a second transparent electrode arranged on the at least one light-emitting diode and facing the first transparent electrode, wherein the first transparent electrode may overlap the second transparent electrode in the transmission area in a direction of a thickness of the substrate.

The display device may further include a transparent insulating layer between the first transparent electrode and the second transparent electrode, wherein the transparent insulating layer may directly contact the first transparent electrode and the second transparent electrode in the transmission area.

The insulating layer may include an opening that is apart from the contact hole and extends from a top surface to a bottom surface of the insulating layer, wherein at least a portion of the opening may be located in the transmission area.

The display device may further include an inorganic insulating layer between the substrate and the insulating layer, wherein the first transparent electrode may directly contact the inorganic insulating layer in the opening.

The at least one light-emitting diode may define at least one emission area, and when viewed in a direction perpendicular to the main surface of the substrate, the at least one emission area may be surrounded by the transmission area.

The at least one light-emitting diode may include a vertical-type light-emitting diode.

The at least one light-emitting diode may include a first electrode pad electrically connected to the first transparent electrode and a second electrode pad facing a direction opposite to the first electrode pad and spaced apart from the first electrode pad in a direction of a thickness of the substrate, wherein the display device may further include an adhesive layer including a metal and located between the first transparent electrode and the first electrode pad in the direction of the thickness of the substrate.

The adhesive layer may overlap only the at least one light-emitting diode in the direction of the thickness of the substrate.

The first transparent electrode may include a polycrystalline transparent conductive oxide.

According to an exemplary embodiment of the present inventive concepts, a display device includes a plurality of emission areas each emitting light and a transmission area adjacent to each of the plurality of emission areas and transmitting external light. The display device includes a substrate and a transistor disposed on the substrate. An insulating layer is disposed on the transistor and includes a contact hole and an opening that are spaced apart from each other. A first transparent electrode is disposed on the insulating layer and is electrically connected to the transistor through the contact hole. At least two light-emitting diodes are disposed on the first transparent electrode. Each of the at least two light-emitting diodes includes a PN diode including inorganic semiconductor based-materials. Each of the at least two light-emitting diodes define one emission area of the plurality of emission areas, respectively. A second transparent electrode is disposed on the at least two light-emitting diodes and is electrically connected to the at least two light-emitting diodes. A portion of the first transparent electrode overlaps the opening of the insulating layer in the transmission area in a direction of a thickness of the substrate.

The display device may further include a transparent insulating layer between the first transparent electrode and the second transparent electrode, wherein the transparent insulating layer may contact the first transparent electrode and the second transparent electrode in the transmission area.

The at least two light-emitting diodes may define at least two emission areas, and when viewed in a direction perpendicular to the main surface, one or two emission areas of the at least two emission areas may be surrounded by the transmission area.

The first transparent electrode may include a polycrystalline transparent conductive oxide.

The display device may further include an adhesive layer between each of the at least two light-emitting diodes and the first transparent electrode, wherein the adhesive layer may include at least one metal element among copper, silver, and gold.

According to an exemplary embodiment of the present inventive concepts, a method of manufacturing a display device including at least one emission area emitting light and a transmission area adjacent to the at least one emission area and transmitting external light includes forming a transistor on a substrate. An insulating layer including an opening is formed on the transistor. A first transparent electrode is formed on the insulating layer. The first transparent electrode is electrically connected to the transistor and overlaps the opening of the insulating layer. A light-emitting diode is formed on the first transparent electrode. The light-emitting diode includes a PN diode. A second transparent electrode is formed on the light-emitting diode.

The method may further include forming a metal layer on the first transparent electrode, wherein the arranging of the light-emitting diode may include arranging the light-emitting diode to directly contact the metal layer.

The method may further include removing a portion of the metal layer that does not overlap the light-emitting diode by using, as a mask, the light-emitting diode directly contacting the metal layer.

The first transparent electrode may include a polycrystalline transparent conductive oxide.

The first transparent electrode may overlap the second transparent electrode in the transmission area.

The method may further include forming a transparent insulating layer between the first transparent electrode and the second transparent electrode.

According to an exemplary embodiment of the present inventive concepts, a display device includes a plurality of units disposed in a display area. Each unit includes a plurality of transparent electrodes that are spaced apart from each other. A first plurality of lines extends in a first direction parallel to an upper surface of a substrate of the display device and is arranged in a second direction that is parallel to the upper surface of the substrate and crosses the first direction. A second plurality of lines extends in the second direction and is arranged in the first direction. A transmission area is disposed between adjacent lines of the first plurality of lines and adjacent lines of the second plurality of lines. The transmission area is configured to transmit external light. A plurality of emission areas is adjacent to the transmission area. Each emission area includes a light-emitting diode that emits light. A plurality of the light emitting diodes are disposed on each of the plurality of transparent electrodes. A portion of each of the plurality of transparent electrodes are located in the transmission area.

An area occupied by the transmission area in each unit of the plurality of units in a first plane defined by the first direction and the second direction is at least about 50% or more of a total area of the unit in the first plane.

These and/or other aspects will become apparent and more readily appreciated from the following description of the exemplary embodiments, the accompanying drawings, and claims.

BRIEF DESCRIPTION OF THE DRAWINGS

The above and other aspects, features, and advantages of certain embodiments of the disclosure will be more apparent from the following description taken in conjunction with the accompanying drawings, in which.

DETAILED DESCRIPTION OF EXEMPLARY EMBODIMENTS

Figure 1:
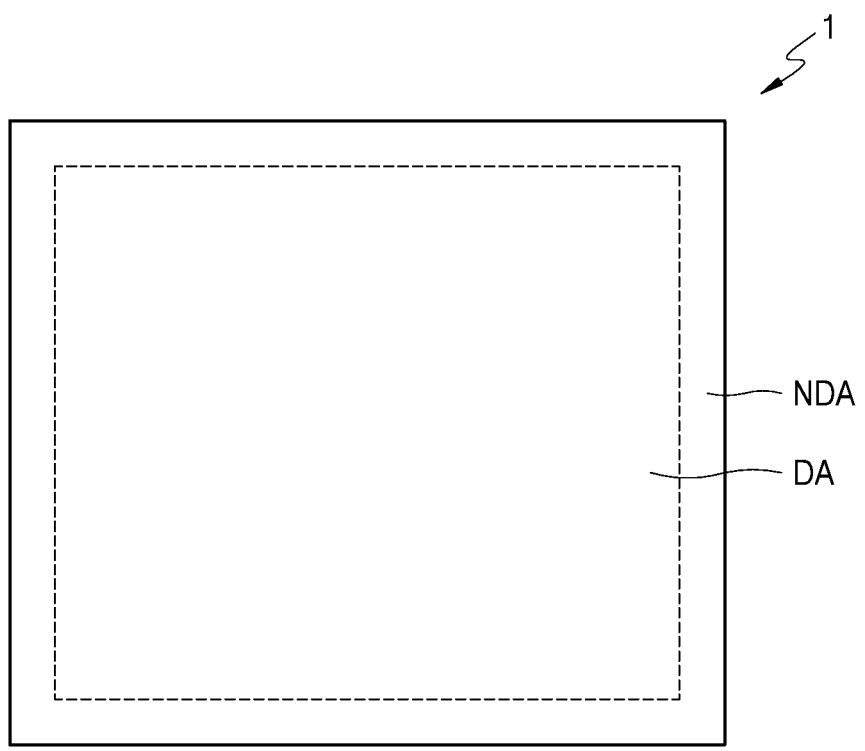
FIG. 1 is a plan view of a display device according to an exemplary embodiment of the present inventive concepts.

Reference will now be made in detail to exemplary embodiments of the present inventive concepts which are illustrated in the accompanying drawings, wherein like reference numerals refer to like elements throughout. In this regard, the exemplary embodiments may have different forms and the present inventive concepts should not be construed as being limited to the descriptions of the exemplary embodiments set forth herein. Accordingly, the exemplary embodiments are merely described below, by referring to the figures, to explain aspects of the present inventive concepts. As used herein, the term "and/or" includes any and all combinations of one or more of the associated listed items. Throughout the disclosure, the expression "at least one of a, b or c" indicates only a, only b, only c, both a and b, both a and c, both b and c, all of a, b, and c, or variations thereof.

It will be understood that although the terms "first," "second," etc. may be used herein to describe various components, these components should not be limited by these terms. These components are only used to distinguish one component from another.

As used herein, the singular forms "a," "an," and "the" are intended to include the plural forms as well, unless the context clearly indicates otherwise.

It will be further understood that the terms "comprises" and/or "comprising" used herein specify the presence of stated features or components, but do not preclude the presence or addition of one or more other features or components.

It will be understood that when a layer, region, or component is referred to as being "formed on" or "disposed on" another layer, region, or component, it can be directly or indirectly formed or disposed on the other layer, region, or component. For example, intervening layers, regions, or components may be present. However, when a layer, region, or component is referred to as being "formed directly on" or "disposed directly on" another layer, region or component, no intervening layers, regions, or components may be present.

Sizes of elements in the drawings may be exaggerated or reduced for convenience of explanation. Therefore, since the sizes and thicknesses of components in the drawings are arbitrarily illustrated for convenience of explanation, exemplary embodiments of the present inventive concepts are not limited thereto.

When an exemplary embodiment may be implemented differently, a specific process order may be performed differently from the described order. For example, two consecutively described processes may be performed substantially at the same time or performed in an order opposite to the described order.

It will be understood that when a layer, region, or component is referred to as being "connected" to another layer, region, or component, it may be "directly connected" to the other layer, region, or component and/or may be "indirectly connected" to the other layer, region, or component with other layer, region, or component interposed therebetween. For example, it will be understood that when a layer, region, or component is referred to as being "electrically connected" to another layer, region, or component, it may be "directly electrically connected" to the other layer, region, or component and may be "indirectly electrically connected" to other layer, region, or component with other layer, region, or component interposed therebetween.

In the present specification, the terms "transparent" or "transmittance" may mean that transmittance of an element in a visible light band is about 50% or more. For example, transmittance in a visible light band may be about 60% or more.

Figure 2:
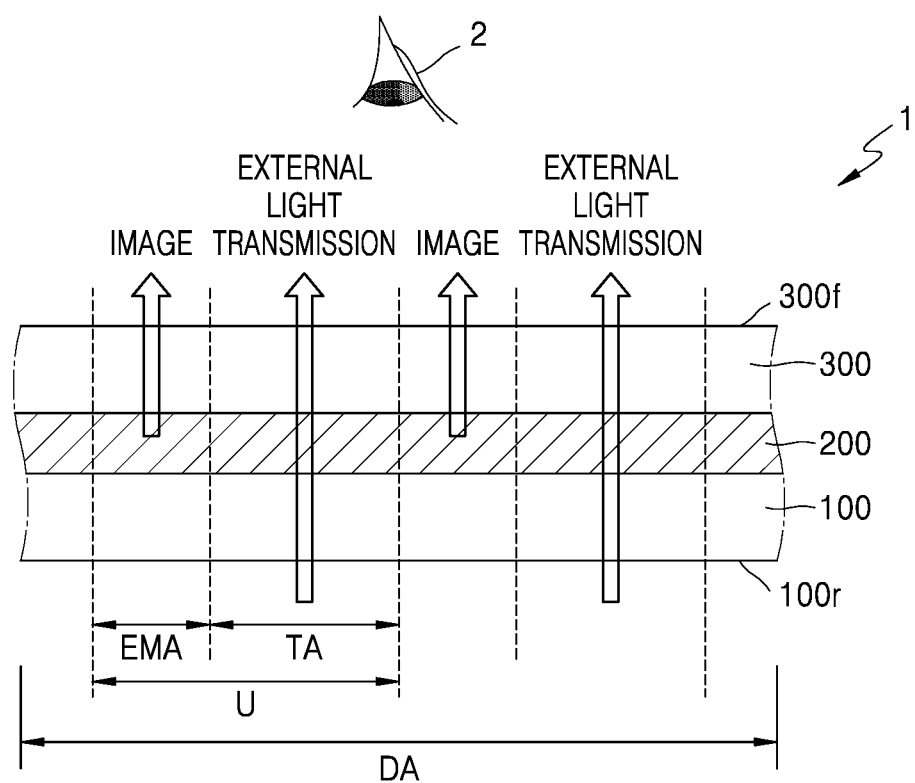
FIG. 2 is a cross-sectional view of a display area of a display device according to an exemplary embodiment of the present inventive concepts.

FIG. 1 is a plan view of a display device 1 according to an exemplary embodiment of the present inventive concepts. FIG. 2 is a cross-sectional view of a display area of the display device 1 according to an exemplary embodiment of the present inventive concepts.

As shown in the exemplary embodiment of FIG. 1, the display device 1 may include a display area DA and a non-display area NDA outside the display area DA. The display area DA is a region in which an image is displayed, and may be surrounded by the non-display area NDA. For example, in the exemplary embodiment shown in FIG. 1, the display area DA is substantially square-shaped and the non-display area NDA surrounds all four sides of the display area DA. However, exemplary embodiments of the present inventive concepts are not limited thereto and in other exemplary embodiments the display area may have various different shapes and/or the non-display area NDA may not surround at least one side of the display area DA. The non-display area NDA is a region in which an image is not displayed. In an exemplary embodiment, at least one driver and at least one pad may be arranged in the non-display area NDA. The driver provides an electric signal or power to a circuit element and/or a light-emitting element arranged in the display area DA. The pad may be electrically connected to an electronic element, a printed circuit board, etc.

Referring to the exemplary embodiment of FIG. 2, the display area DA may include a light-emission area EMA (hereinafter, "emission area") and a transmission area TA. The emission area EMA emits light having a predetermined color. The transmission area TA transmits external light. For example, the transmission area TA is a region having a light transmission property, and a transmittance of the transmission area TA in a visible light band may be about 50% or more, such as about 60% or more as described above. The emission area EMA may be adjacent to the transmission area TA (e.g., in a direction parallel to an upper surface of a substrate 100 that the emission area EMA and transmission area TA are formed thereon). In an exemplary embodiment, the display area DA may include a plurality of units U. Each of the plurality of units U include the emission area EMA and the transmission area TA. The unit U may include at least one emission area EMA and at least one transmission area TA.

External light is light that is incident to the display device 1 from the outside of the display device 1. External light may pass through the transmission area TA of the display device 1. For example, an image of an object arranged on a rear surface 100r of a substrate 100 may be viewed by a user 2 located over a front surface 300f of an encapsulation member 300 through the transmission area TA. External light may travel from the rear surface 10r of the substrate 100 toward the encapsulation member 300 and may be recognized by the user 2 located over the front surface 300f of the encapsulation member 300 through the display device 1.

At least one light-emitting element, for example, a light-emitting diode, may be arranged in the emission area EMA. The at least one light-emitting element emits light having a predetermined color to display an image. Light emitted from the emission area EMA is different from the external light that is transmitted through the transmission area TA. Light emitted from the emission area EMA is light emitted from a display element, for example, a light-emitting diode, provided in a display layer 200. For example, in an exemplary embodiment, the display area DA may display an image by using red, green, and/or blue light emitted from a light-emitting diode.

The user 2 may be located over the front surface 300f of the encapsulation member 300. The user 2 may observe an image provided by the display device 1 itself (e.g. an image generated by light-emitting diodes arranged in the emission area EMA) and an image generated by the external light transmitted through the transmission area TA. In an exemplary embodiment, the user 2 may recognize both an image of an object arranged on a location corresponding to a rear surface of the display device 1 (e.g., the rear surface 100r of the substrate 100) generated by the external light transmitted through the transmission area TA and an image generated by the light-emitting diodes in the emission area EMA. In an exemplary embodiment, in instances in which the display device 1 is turned off, the user 2 may recognize an image of an object neighboring the rear surface of the display device 1, for example, the rear surface 100r of the substrate 100 generated by the light transmitted through the transmission area TA. In an exemplary embodiment, in instances in which the display device 1 is turned on, the user 2 may recognize both an image of an object neighboring the rear surface of the display device 1, for example, the rear surface 100r of the substrate 100, and an image emitted from the light-emitting diodes.

As shown in the exemplary embodiment of FIG. 2, the display device 1 may include the substrate 100, the display layer 200, and the encapsulation member 300 covering the display layer 200. Both the substrate 100 and the encapsulation member 300 may have a light transmission characteristic. For example, in an exemplary embodiment, the substrate 100 may include at least one material selected from a transparent glass material or a transparent polymer material. In an exemplary embodiment, the encapsulation member 300 may include a substrate having at least one material selected from a transparent glass material or a transparent polymer material, or have a stacked structure of at least one inorganic encapsulation layer and at least one organic encapsulation layer. For example, the encapsulation member 300 may include an organic encapsulation layer arranged between a first inorganic encapsulation layer and a second inorganic encapsulation layer. The organic encapsulation layer may include an organic insulating material. The first and second inorganic encapsulation layers may each include an inorganic insulating material.

Figure 3:
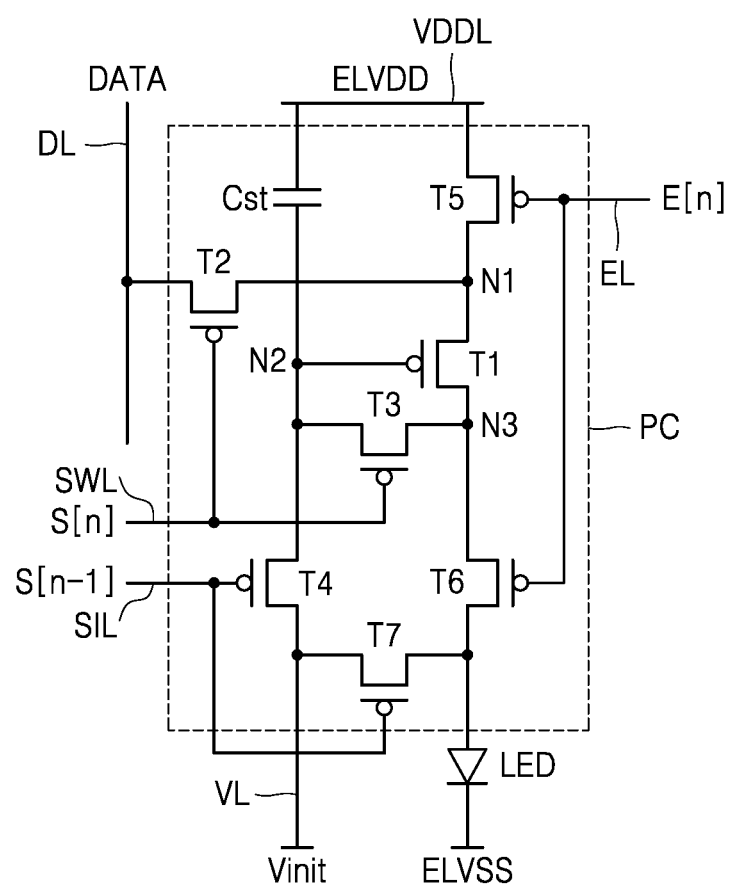
FIG. 3 is a diagram of a circuit connected to a light-emitting diode of a display device according to an exemplary embodiment of the present inventive concepts.

FIG. 3 is a diagram of a circuit connected to one of light-emitting diodes provided to the display device 1 according to an exemplary embodiment of the present inventive concepts.

Referring to the exemplary embodiment of FIG. 3, a light-emitting diode LED may be electrically connected to a circuit element PC including at least two transistors and at least one storage capacitor. For example, as shown in the exemplary embodiment of FIG. 3, the circuit element PC may include seven transistors and one storage capacitor. However, exemplary embodiments of the present inventive concepts are not limited thereto.

A first transistor T1 includes a gate electrode, a first electrode, and a second electrode. The gate electrode of the first transistor T1 is connected to a first electrode of the storage capacitor Cst. The first electrode of the first transistor T1 is connected to a first node N1. The second electrode of the first transistor T1 is connected to a third node N3. The first transistor T1 serves as a driving transistor. The first transistor T1 receives a data signal DATA according to a switching operation of a second transistor T2, and supplies a current to the light-emitting diode LED.

The second transistor T2 includes a gate electrode, a first electrode, and a second electrode. The gate electrode of the second transistor T2 is connected to a scan line SWL that is connected to a circuit element PC. The first electrode of the second transistor T2 is connected to a data line DL. The second electrode of the second transistor T2 is connected to the first electrode of the first transistor T1 at the first node N1. The second transistor T2 is turned on in response to a scan signal S[n] transferred through the scan line SWL. The second transistor T2 performs the switching operation of transferring a data signal DATA transferred through the data line DL to the first electrode of the first transistor T1.

A third transistor T3 includes a gate electrode, a first electrode, and a second electrode. The gate electrode of the third transistor T3 is connected to the scan line SWL. The first electrode of the third transistor T3 is connected to the second electrode of the first transistor T1 at the third node N3. The second electrode of the third transistor T3 is connected to the first electrode of the storage capacitor Cst, a second electrode of a fourth transistor T4, and the gate electrode of the first transistor T1 at the second node N2. The third transistor T3 is turned on in response to a scan signal S[n] transferred through the scan line SWL to diode-connect the first transistor T1.

The fourth transistor T4 includes a gate electrode, a first electrode, and a second electrode. The gate electrode of the fourth transistor T4 is connected to a previous scan line SIL. The first electrode of the fourth transistor T4 is connected to an initialization voltage line VL. The second electrode of the fourth transistor T4 is connected to the first electrode of the storage capacitor Cst, the second electrode of the third transistor T3, and the gate electrode of the first transistor T1 at the second node N2. The first electrode and the second electrode of the fourth transistor T4 may be respectively a source electrode or a drain electrode depending on the direction of a current. The fourth transistor T4 is turned on in response to a previous scan signal S [n−1] transferred through the previous scan line SIL, and performs an initialization operation of initializing a voltage of the gate electrode of the first transistor T1 by transferring an initialization voltage Vinit to the gate electrode of the first transistor T1.

A fifth transistor T5 includes a gate electrode, a first electrode, and a second electrode. The gate electrode of the fifth transistor T5 is connected to an emission control line EL. The first electrode of the fifth transistor T5 is connected to a first power voltage line VDDL. The second electrode of the fifth transistor T5 is connected to the first electrode of the first transistor T1 and the second electrode of the second transistor T2 at the first node N1.

A sixth transistor T6 includes a gate electrode, a first electrode, and a second electrode. The gate electrode of the sixth transistor T6 is connected to the emission control line EL. The first electrode of the sixth transistor T6 is connected to the second electrode of the first transistor T1 and the first electrode of the third transistor T3 at the third node N3. The second electrode of the sixth transistor T6 is connected to a first electrode pad of the light-emitting diode LED.

The fifth transistor T5 and the sixth transistor T6 are simultaneously turned on in response to an emission control signal E[n] transferred through the emission control line EL, the first power voltage ELVDD is transferred to the light-emitting diode LED, and a current flows through the light-emitting diode LED.

A seventh transistor T7 includes a gate electrode, a first electrode, and a second electrode. The gate electrode of the seventh transistor T7 is connected to the previous scan line SIL. The first electrode of the seventh transistor T7 is connected to the second electrode of the sixth transistor T6 and a first electrode pad of the light-emitting diode LED. The second electrode of the seventh transistor 17 is connected to the initialization voltage line VL. The first electrode and the second electrode of the seventh transistor T7 may be respectively a source electrode or a drain electrode depending on the direction of a current. The seventh transistor T7 is turned on in response to a previous scan signal S[n−1] transferred through the previous scan line SIL and performs an initialization operation of initializing the light-emitting diode LED by transferring the initialization voltage Vinit to the first electrode pad of the light-emitting diode LED.

The storage capacitor Cst includes the first electrode and a second electrode. The first electrode of the storage capacitor Cst is connected to the gate electrode of the first transistor T1, the second electrode of the third transistor T3, and the second electrode of the fourth transistor T4. The second electrode of the storage capacitor Cst is connected to the first power voltage line VDDL.

A second electrode pad of the light-emitting diode LED is connected to a second power source supplying a second power voltage ELVSS.

While the previous scan line SIL is connected to the gate electrode of the seventh transistor T7 in the exemplary embodiment of FIG. 3, the gate electrode of the seventh transistor T7 may be connected to the scan line SWL or the next scan line in other exemplary embodiments. While the gate electrodes of the first to seventh transistors T1 to T7 in the exemplary embodiment of FIG. 3 are single gate electrodes, in other exemplary embodiments, at least one gate electrode may be a dual gate electrode, etc.

Figure 4:
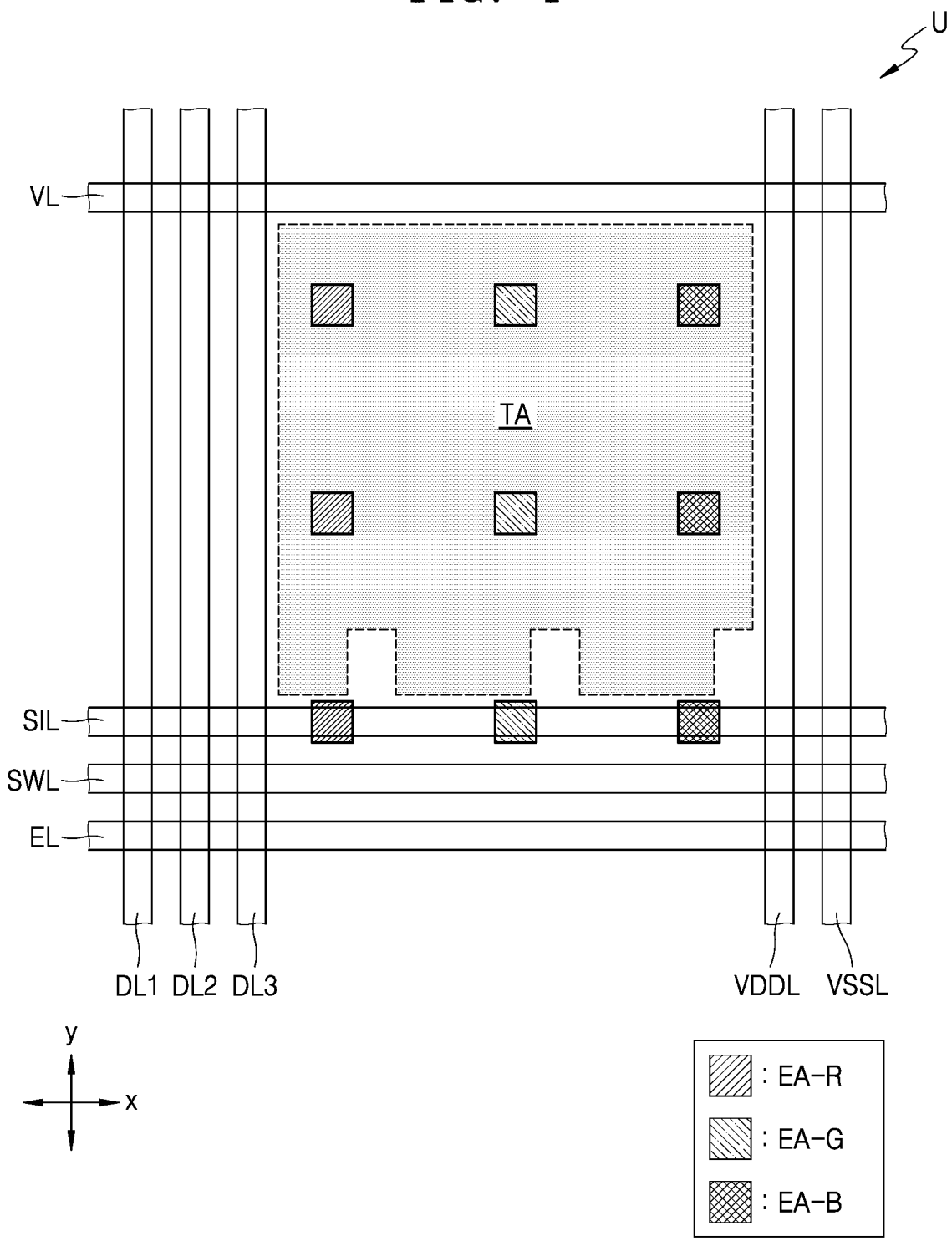
FIG. 4 is a plan view of a unit of a display device that includes an emission area and a transmission area according to an exemplary embodiment of the present inventive concepts.

FIG. 4 is a plan view of one unit U including an emission area EA-R, EA-G and EA-B and a transmission area v, as a portion of the display device 1 according to an exemplary embodiment of the present inventive concepts.

Referring to the exemplary embodiment of FIG. 4, a plurality of lines may extend in a y direction and an x direction. The x direction and the y direction may be parallel to an upper surface of the substrate 100 and the x direction and the y direction may intersect each other. For example, as shown in the exemplary embodiment of FIG. 4, the x direction may be perpendicular to the y direction. As shown in the exemplary embodiment of FIG. 4, a first data line DL1, a second data line DL2, a third data line DL3, the first power voltage line VDDL, and a second power voltage line VSSL may extend in the y direction. The scan line SWL, the previous scan line SIL, the emission control line EL, and the initialization voltage line VL may extend in the x direction intersecting with the y direction.

The transmission area TA may be defined between adjacent lines among the lines extending in the x direction and adjacent lines among the lines extending in the y direction. For example, as shown in the exemplary embodiment of FIG. 4, the transmission area TA is disposed between the third data line DL3 and the first power voltage line VDDL extending in the y direction, and between the previous scan line SIL and the initialization voltage line VL extending in the x direction. However, exemplary embodiments of the present inventive concepts are not limited thereto.

In an exemplary embodiment, the First to third data lines DL1, DL2, and DL3 among the lines extending in the y direction may be positioned on one side of the transmission area TA (e.g., the left side in the x direction), and the first power voltage line VDDL and the second power voltage line VSSL among the lines extending in the y direction may be positioned on another side of the transmission area TA (e.g. the right side in the x direction). This arrangement of the lines may provide a relatively large area of the transmission area TA.

The transmission area TA is a region through which external light may pass. The transmission area TA may not overlap lines, a circuit element connected to the lines, a connection region of a first transparent electrode and a thin film transistor described below, and an emission area described below. The emission area EMA (see FIG. 2) may be adjacent to the transmission area TA. For example, a red emission area EA-R, a green emission area EA-G, and a blue emission area EA-B each may be adjacent to the transmission area TA.

In an exemplary embodiment, each unit U may include a plurality of red emission areas EA-R, a plurality of green emission areas EA-G, and a plurality of blue emission areas EA-B. As shown in the exemplary embodiment of FIG. 4, at least one of the plurality of red emission areas EA-R may be surrounded by the transmission area TA (e.g., in a plan view of a plane defined by the x direction and the y direction). Similarly, at least one of the plurality of green emission areas EA-G may be surrounded by the transmission area TA. At least one of the plurality of blue emission areas EA-B may be surrounded by the transmission area TA. For example, as shown in the exemplary embodiment of FIG. 4, the upper and center (e.g., in the y direction) red emission areas EA-R, green emission areas EA-G and blue emission areas EA-B may be completely surrounded by the transmission area TA.

The plurality of red emission areas EA-R, the plurality of green emission areas EA-G, and the plurality of blue emission areas EA-B may be arranged between adjacent lines among the lines extending in the y direction or between neighboring lines among the lines extending in the x direction. For example, as shown in the exemplary embodiment of FIG. 4, each of the plurality of red emission areas EA-R, the plurality of green emission areas EA-G, and the plurality of blue emission areas EA-B are arranged between the third data line DL3 and the first power voltage line VDDL extending in the y direction.

At least one emission area of each of the plurality of red emission areas EA-R, the plurality of green emission areas EA-G, and the plurality of blue emission areas EA-B may be partially surrounded by the transmission area TA and may overlap lines extending in the x direction or y direction. For example, as shown in the exemplary embodiment of FIG. 4, the lower (e.g., in the y direction) red emission area EA-R, the green emission area EA-G, and the blue emission area EA-B each may overlap the previous scan line SIL extending in the x direction, and the emission areas overlapping the previous scan line SIL may not be entirely surrounded by the transmission area TA. For example, as shown in the exemplary embodiment of FIG. 4, the lower red emission area EA-R, the lower green emission area EA-G and the lower blue emission area EA-B may only be adjacent to the transmission area TA on upper sides thereof.

Figure 5A:
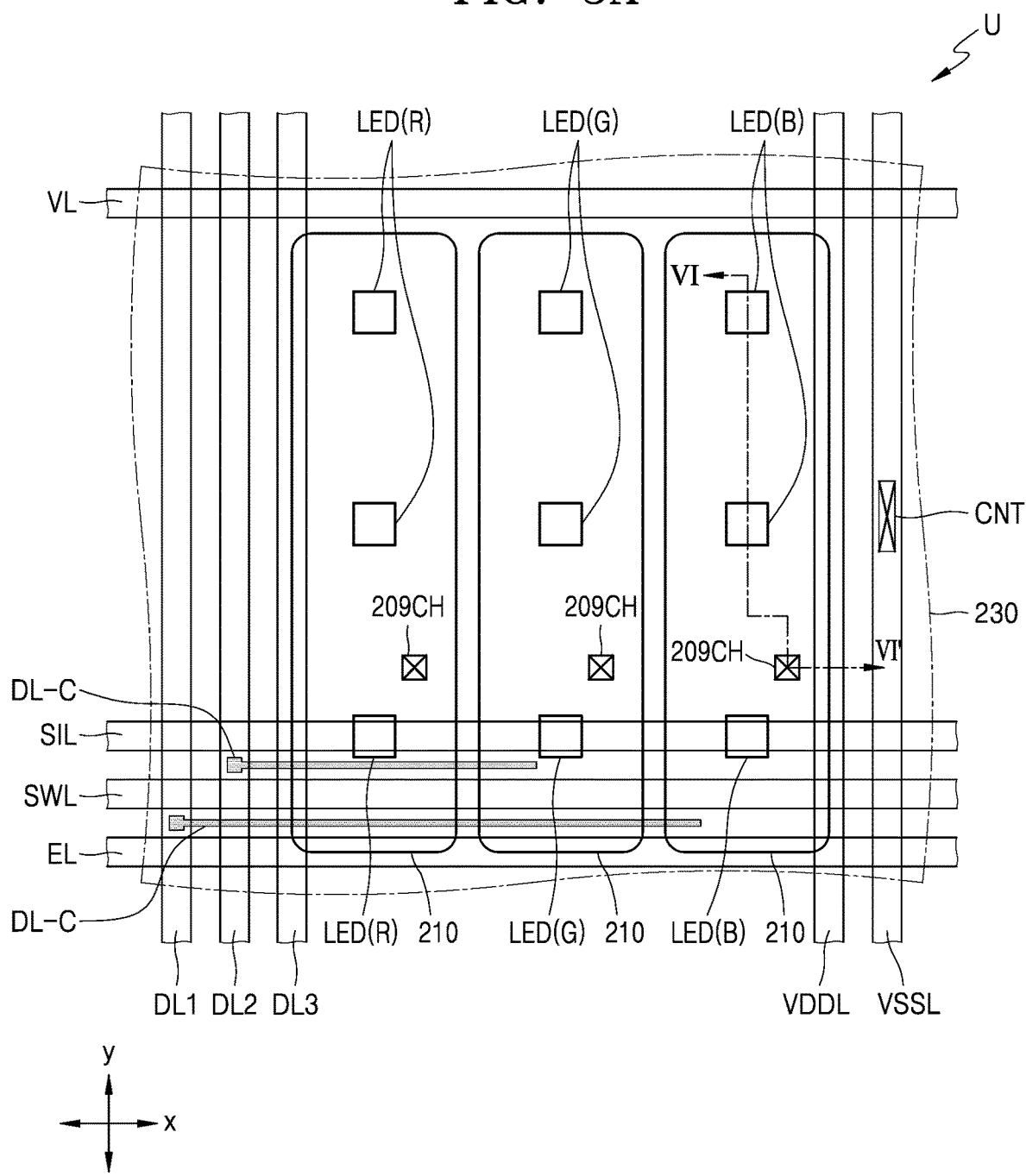
FIG. 5A is a plan view of a unit of a display device that includes a light-emitting diode and electrodes according to an exemplary embodiment of the present inventive concepts.

FIG. 5A is a plan view of locations of a light-emitting diode LED and electrodes 210 and 230 arranged in one unit U, as a portion of the display device 1 according to an exemplary embodiment of the present inventive concepts.

Referring to the exemplary embodiment of FIG. 5A, at least one first transparent electrode 210 may be arranged between lines extending in they direction. For example, the first transparent electrode 210 may be disposed between the third data line DL3 and the first power voltage line VDDL which extend in the y direction. As shown in the exemplary embodiment of FIG. 5A, three first transparent electrodes 210 may be adjacent to each other between the lines extending in the y direction. A center one (e.g., in the x direction) of the first transparent electrodes 210 is disposed between the third data line DL3 and the first power voltage line VDDL and does not overlap either of the third data line DL3 or the first power voltage line VDDL. A left one (e.g., in the x direction) of the first transparent electrodes 210 overlaps the third data line DL3. A right one (e.g., in the x direction) of the first transparent electrodes 210 overlaps the first power voltage line VDDL.

Each of the first transparent electrodes 210 may have a length in the y direction and a width in the x direction. In an exemplary embodiment, a length of each first transparent electrode 210 in the y direction may be greater than the width in the x direction.

At least one light-emitting diode may be arranged on each first transparent electrode 210. For example, as shown in the exemplary embodiment of FIG. 5A, the red light-emitting diodes LED(R) are arranged on the left one of the first transparent electrodes 210, the green light-emitting diodes LED(G) are arranged on the center one of the first transparent electrodes 210, and blue light-emitting diodes LED (B) are arranged on the right one of the first transparent electrodes 210. Two or more light-emitting diodes LED that may emit light having the same color may be arranged on each first transparent electrode 210 in event of damage, deterioration, or defect of one of the light-emitting diodes LED. For example, as shown in the exemplary embodiment of FIG. 5A, three light-emitting diodes LED are arranged for each first transparent electrode 210.

Each first transparent electrode 210 may emit red, green, or blue light. As shown in FIG. 5A, in an exemplary embodiment in which three light-emitting diodes LED of a same color are arranged on each first transparent electrode 210, three red emission areas EA-R (see FIG. 4), three green emission areas EA-B (see FIG. 4), and three blue emission areas EA-B (see FIG. 4) may be provided to each unit U. A location of each light-emitting diode LED of FIG. 5A may correspond to an emission area of FIG. 4, for example, a red emission area EA-R, a green emission area EA-G. or a blue emission area EA-B.

The light-emitting diodes LED include PN-junction diodes ("PN diodes") including inorganic semiconductor-based materials. When a voltage is applied to a PN-junction diode in a forward direction, holes and electrons are injected from the PN-junction diode, energy generated from recombination of holes and electrons is converted into light energy, and light having a predetermined color may be emitted. In an exemplary embodiment, the light-emitting diode LED may have a width of several micrometers to hundreds of micrometers. For example, a width of the light-emitting diode LED in one direction, for example, a maximum width of the light-emitting diode LED, may correspond to about 1 μm to about 100 μm. In an exemplary embodiment, the light-emitting diode LED may be a micro light-emitting diode.

In an exemplary embodiment, the plurality of red, green, and blue light-emitting diodes LED may be covered by a second transparent electrode 230 facing the first transparent electrode 210. The second transparent electrode 230 may be electrically connected to the second power voltage line VSSL through a contact hole CNT. The contact hole CNT may be formed in at least one insulating layer arranged between the second power voltage line VSSL and the second transparent electrode 230. A specific structure of the second transparent electrode 230 is described below with reference to the exemplary embodiment of FIG. 6.

In an exemplary embodiment as shown in FIG. 5A in which the first to third data lines DL1, DL2, and DL3 among the adjacent lines extending in the y direction are positioned on one side of the transmission area TA (e.g. the left side in the x direction), a data signal may be provided, through a data connection line DL-C, to one of transistors among circuit elements neighboring a portion of the first transparent electrode 210. For example, the circuit element PC described in FIG. 3 may overlap a portion of each first transparent electrode 210, and the second transistor T2 (see FIG. 3), which is a switching transistor of each circuit element PC, may receive a data signal through the data connection line DL-C.

In the exemplary embodiment shown in FIG. 5A, the first data line DL1 and the second data line DL2 are connected to the data connection line DL-C. Each data connection line DL-C may be formed as one body with a relevant data line among the first data line DL1 and the second data line DL2. However, in an alternative embodiment, each data connection line DL-C may be formed on a layer different from a relevant data line among the first data line DL1 and the second data line DL2, and connected to the relevant data line through a contact hole.

Figure 5B:
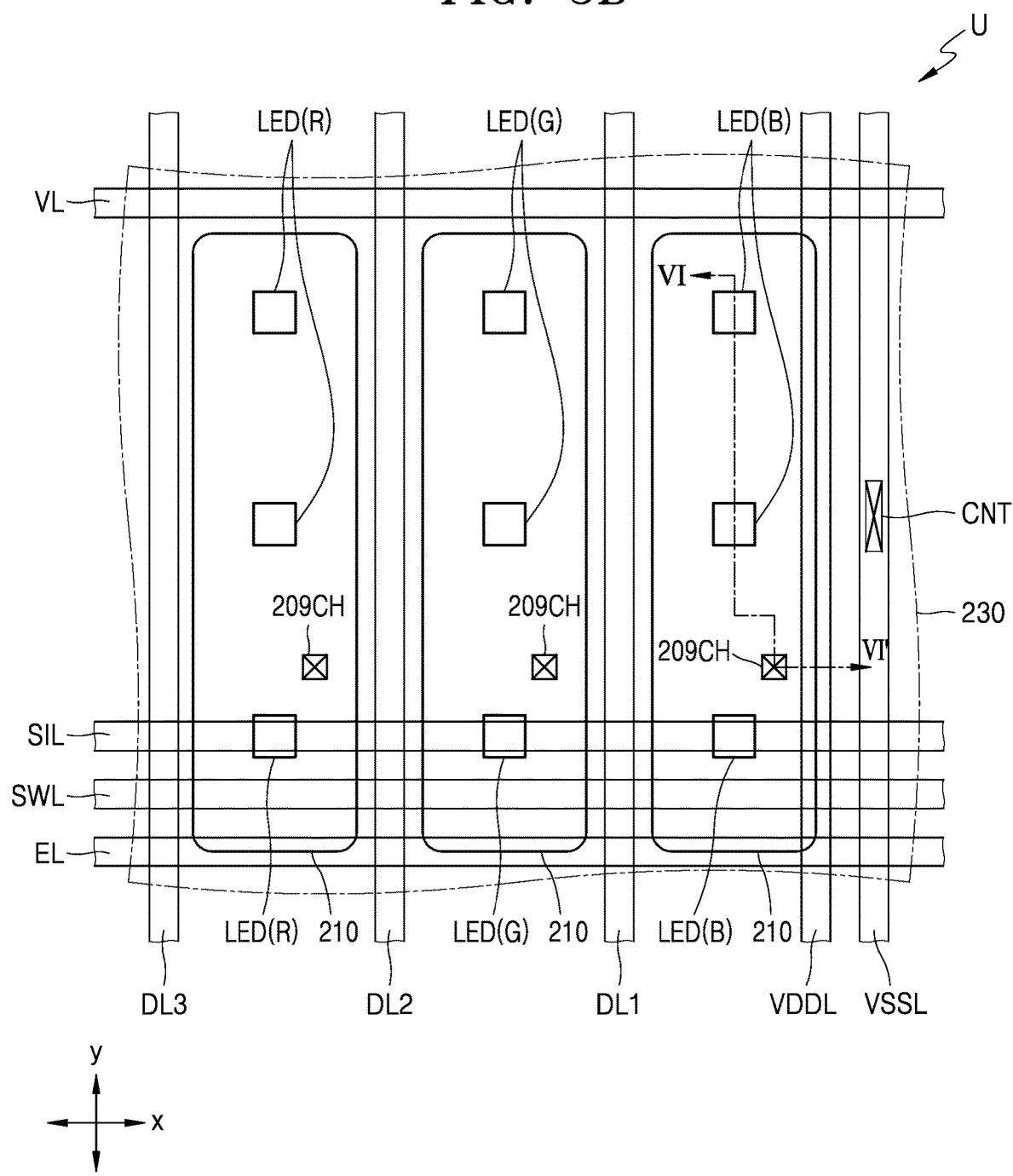
FIG. 5B is a plan view of a unit of a display device that includes a light-emitting diode and electrodes according to an exemplary embodiment of the present inventive concepts.

FIG. 5B is a plan view of locations of a light-emitting diode and electrodes 210 and 230 arranged in one unit U, as a portion of the display device 1 according to an exemplary embodiment of the present inventive concepts. In the exemplary embodiment of FIG. 5B, since other structures are the same as those of FIG. 5A except for the arrangement of the data lines extending in the y direction, descriptions of the other structures of FIG. 5B are omitted. Referring to the exemplary embodiment of FIG. 5B, the first to third data lines DL1, DL2, and DL3 may be spaced apart from each other in the x direction and may not be arranged adjacent to each other on one side of the transmission area TA. The left one (e.g., in the x direction) of the first transparent electrodes 210 is disposed between the third data line DL3 and the second data line DL2. A center one (e.g., in the x direction) of the first transparent electrodes 210 is disposed between the second data line DL2 and the first data line DL1. A right one (e.g., in the x direction) of the first transparent electrodes 210 is disposed between the first data line DL1 and the first power voltage line VDDL.

Figure 6:
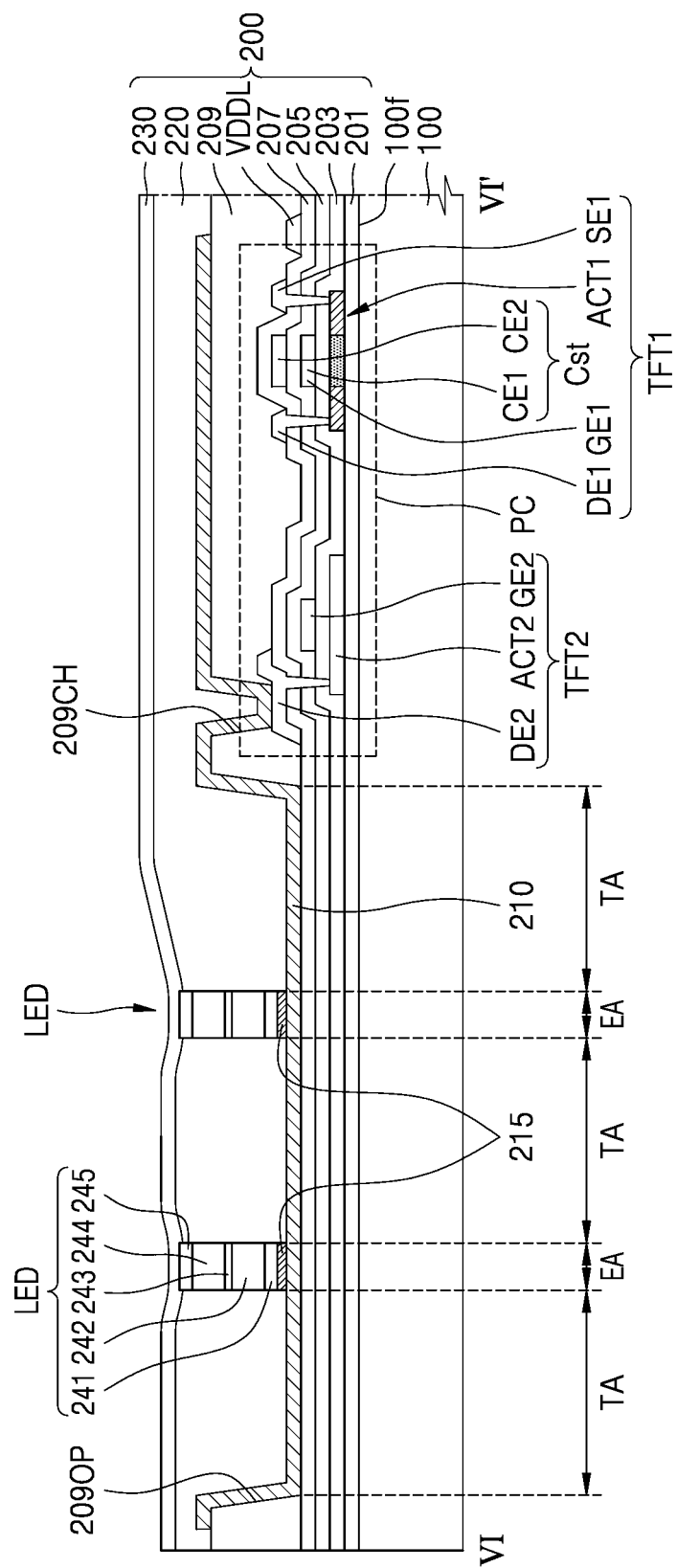
FIG. 6 is across-sectional view of a display device taken along line VI-VI' of FIG. 5A or SB according to an exemplary embodiment of the present inventive concepts.

FIG. 6 is a cross-sectional view of the display device 1 taken along line VI-VI' of FIG. 5A or 5B according to an exemplary embodiment of the present inventive concepts.

Referring to the exemplary embodiment of FIG. 6, the display layer 200 is disposed on the substrate 100. The display layer 200 includes the first transparent electrode 210 and the second transparent electrode 230. Each light-emitting diode LED is electrically connected to the circuit element PC including transistors, and the display layer 200 includes the circuit elements PC. As described with reference to the exemplary embodiment of FIG. 2, the display layer 200 may be covered by the encapsulation member 300.

However, for convenience of description, the encapsulation member is omitted in the exemplary embodiment of FIG. 6.

The substrate 100 may include various materials. For example, in an exemplary embodiment, the substrate 100 may include a transparent glass material including silicon oxide ($SiO_2$) as a main component, or may include a transparent plastic material. The substrate 100 may include a transparent plastic material having flexibility. In an exemplary embodiment, the plastic material may include an insulating organic material such as at least one compound selected from polyethersulfone, polyacrylate, polyetherimide, polyethylene naphthalate, polyethylene terephthalate, polyphenylene sulfide, polyarylate, polyimide, polycarbonate, cellulose tri acetate, and cellulose acetate propionate.

The circuit element PC may be formed over the substrate 100. As shown in the exemplary embodiment of FIG. 6, the circuit element PC may be arranged outside of the transmission area TA of the substrate 100. For example, the circuit element PC may be arranged on one side of the transmission area TA. The circuit element PC may include a first thin film transistor TFT1, a second thin film transistor TFT2, and a storage capacitor Cst. In an embodiment in which the circuit element PC has a circuit structure described above with reference to the exemplary embodiment of FIG. 3, the first thin film transistor TFT1 of FIG. 6 may correspond to the first transistor T1 of FIG. 3, and the second thin film transistor TFT2 may correspond to the sixth transistor T6 of FIG. 3.

A buffer layer 201 may be disposed between the substrate 100 and the circuit element PC. For example, as shown in the exemplary embodiment of FIG. 6, a lower surface of the buffer layer 201 may directly contact an upper surface of the substrate 100. In an exemplary embodiment, the buffer layer 201 may include an inorganic insulating material such as at least one compound selected from silicon nitride, silicon oxide, and silicon oxynitride. The buffer layer 201 may have a single layer or a multi-layered structure including the above materials.

The first thin film transistor TFT1 and the second thin film transistor TFT2 may respectively include a first semiconductor layer ACT1 and a second semiconductor layer ACT2. In an exemplary embodiment, the first semiconductor layer ACT1 and the second semiconductor layer ACT2 may include amorphous silicon or polycrystalline silicon. However, exemplary embodiments of the present inventive concepts are not limited thereto. For example, in another exemplary embodiment, the first semiconductor layer ACT1 and the second semiconductor layer ACT2 may include an organic semiconductor material or an oxide semiconductor material.

A first gate electrode GE1 may overlap a channel region of the first semiconductor layer ACT1, and a second gate electrode GE2 may overlap a channel region of the second semiconductor layer ACT2. In an exemplary embodiment, the first gate electrode GE1 and the second gate electrode GE2 each may include at least one compound selected from aluminum (Al), platinum (Pt), palladium (Pd), silver (Ag), magnesium (Mg), gold (Au), nickel (Ni), neodymium (Nd), iridium (Ir), chrome (Cr), lithium (Li), calcium (Ca), molybdenum (Mo), titanium (Ti), tungsten (W), and copper (Cu) and may include a single layer or a multi-layer including the above materials.

A gate insulating layer 203 may be arranged between the first gate electrode GE and the second gate electrode GE2, and the first semiconductor layer ACT1 and the second semiconductor layer ACT2. In an exemplary embodiment, the gate insulating layer 203 may include an inorganic insulating material such as silicon nitride, silicon oxide, and/or silicon oxynitride. The gate insulating layer 203 may include a single layer or a multi-layered structure including the above materials.

A first interlayer insulating layer 205 may be formed on the first gate electrode GE1 and the second gate electrode GE2. For example, as shown in the exemplary embodiment of FIG. 6, a lower surface of the first interlayer insulating layer 205 may directly contact an upper surface of the first gate electrode GE1 and the second gate electrode GE2. In an exemplary embodiment, the first interlayer insulating layer 205 may include an inorganic insulating material such as at least one compound selected from silicon nitride, silicon oxide, and silicon oxynitride. The first interlayer insulating layer 205 may include a single layer or a multi-layered structure including the above materials.

The storage capacitor Cst may include a first electrode CE1 and a second electrode CE2 overlapping each other (e.g., in a thickness direction of the substrate 100). In an exemplary embodiment, the first gate electrode GE1 of the first thin film transistor TFT1 may include the first electrode CE1 of the storage capacitor Cst. The first interlayer insulating layer 205 may be arranged between the first electrode CE1 and the second electrode CE2. The second interlayer insulating layer 207 may be disposed on the second electrode CE2. For example, as shown in the exemplary embodiment of FIG. 6, a lower surface of the second interlayer insulating layer 207 may directly contact upper surfaces of the second electrode CE2 and the first interlayer insulating layer 205. In an exemplary embodiment, the second interlayer insulating layer 207 may include an inorganic insulating material such as at least one compound selected from silicon nitride, silicon oxide, and silicon oxynitride. The second interlayer insulating layer 207 may include a single layer or a multi-layered structure including the above materials.

A first source electrode SE1 and a first drain electrode DE1 may be disposed on the second interlayer insulating layer 207 overlapping the first semiconductor layer ACT1. Similarly, a second source electrode or a second drain electrode DE2 may be disposed on the second interlayer insulating layer 207 to overlap with the second semiconductor layer ACT2. For example, as shown in the exemplary embodiment of FIG. 6, a second drain electrode DE2 overlaps the second semiconductor layer ACT.

The first source electrode SE1, the first drain electrode DE1, the second drain electrode DE2, and the first power voltage line VDDL may be located on the same layer as the first to third data lines DL1, DL2, and DL3 described with reference to the exemplary embodiment of FIG. 5A and/or the second power voltage line VSSL (see FIGS. 5A and 5B) and may include the same material as the material of the first to third data lines DL1, DL2, and DL3 and/or the second power voltage line VSSL.

In an exemplary embodiment, the first source electrode SE1, the first drain electrode DE1, and the second drain electrode DE2 may include at least one compound selected from aluminum (Al), platinum (Pt), palladium (Pd), silver (Ag), magnesium (Mg), gold (Au), nickel (Ni), neodymium (Nd), iridium (Ir), chrome (Cr), lithium (Li), calcium (Ca), molybdenum (Mo), titanium (Ti), tungsten (W), and copper (Cu) and may include a single layer or a multi-layered structure including the above materials.

As shown in the exemplary embodiment of FIG. 6, the circuit element PC may be covered by an organic insulating layer 209. In an exemplary embodiment, the organic insulating layer 209 may include a general-purpose polymer such as polymethylmethacrylate (PMMA) or polystyrene (PS), polymer derivatives having a phenol-based group, an acryl-based polymer, an imide-based polymer, an aryl ether-based polymer, an amide-based polymer, a fluorine-based polymer, a p-xylene-based polymer, a vinyl alcohol-based polymer, and a blend thereof.

The organic insulating layer 209 may include a contact hole 209CH and an opening 209OP spaced apart from the contact hole 209CH. In an exemplary embodiment, the opening 209OP of the organic insulating layer 209 may extend from an upper surface (e.g., a top surface) to a lower surface (e.g., a bottom surface) of the organic insulating layer 209. The circuit element PC electrically connects to the first transparent electrode 210 through the contact hole 209CH.

The first transparent electrode 210 may cover the opening 209OP and the contact hole 209CH. A portion (e.g. a majority) of the first transparent electrode 210 may be located in the opening 209OP of the organic insulating layer 209. As shown in the exemplary embodiment of FIG. 6, a lower surface of the first transparent electrode 210 may directly contact an upper surface of the second interlayer insulating layer 207 in the opening 209OP. Another portion of the first transparent electrode 210 may be located on a top surface of the organic insulating layer 209, and the first transparent electrode 210 may be electrically connected to the circuit element PC through the contact hole 209CH. A majority of the first transparent electrode 210 may be located in the opening 209OP of the organic insulating layer 209. For example, in an exemplary embodiment, a portion occupying an area of about 50% or more of the first transparent electrode 210, such as a portion occupying an area of about 70% or more of the first transparent electrode 210 may be located in the opening 209OP of the organic insulating layer 209. A first edge of the first transparent electrode 210 may be located on a top surface of the organic insulating layer 209 spaced apart from lateral sidewalls of the organic insulating layer 209 that defines the opening 209OP.

The first transparent electrode 210 may include a transparent conductive oxide. In an exemplary embodiment, the first transparent electrode 210 may include polycrystalline transparent conductive oxide. For example, the first transparent electrode 210 may include polycrystalline indium tin oxide (ITO). Alternatively, the first transparent electrode 210 may include at least one compound selected from polycrystalline indium zinc oxide (IZO), zinc oxide (ZnO), indium oxide ($In_2O_3$), indium gallium oxide (IGO), and aluminum zinc oxide (AZO).

The light-emitting diode LED is disposed on the first transparent electrode 210. In an exemplary embodiment, at least one light-emitting diode LED may be disposed on the first transparent electrode 210 overlapping the opening 209OP of the organic insulating layer 209. As shown in the exemplary embodiment of FIG. 6, two light-emitting diodes LED may be disposed on the first transparent electrode 210 and overlap the opening 209OP of the organic insulating layer 209.

The light-emitting diode LED may include a first semiconductor layer 242, a second semiconductor layer 244, and an active layer 243. The active layer 243 is disposed between the first semiconductor layer 242 and the second semiconductor layer 244 (e.g., in a thickness direction of the substrate 100).

In an exemplary embodiment, the first semiconductor layer 242 may include, for example, a p-type semiconductor layer. In an exemplary embodiment, the first semiconductor layer 242 may include a semiconductor material having a composition formula of $In_xAl_yGa_{1-x-y}N$ ($0 \leq x \leq 1$, $0 \leq y \leq 1$, and $0 \leq x+y \leq 1$). The first semiconductor layer 242 may include at least one compound selected from GaN, AlN, AlGaN, OnGaN, InN, InAlGaN, and AlInN and may be doped with a p-type dopant such as Mg, Zn, Ca, Sr, and Br.

The second semiconductor layer 244 may include, for example, an n-type semiconductor layer. In an exemplary embodiment, the second semiconductor layer 244 may include a semiconductor material having a composition formula of $In_xAl_yGa_{1-x-y}N$ ($0 \leq x \leq 1$, $0 \leq y \leq 1$, and $0 \leq x+y \leq 1$). The second semiconductor layer 244 may include at least one compound selected from GaN, AlN, AlGaN, InGaN, InN, InAlGaN, and AlInN and may be doped with a n-type dopant such as Si, Ge, and Sn.

The doped types of the first semiconductor layer 242 and the second semiconductor layer 244 are provided as an example and exemplary embodiments of the present inventive concepts are not limited thereto. For example, in another exemplary embodiment, the first semiconductor layer 242 may include an n-type semiconductor layer, and the second semiconductor layer 244 may include a p-type semiconductor layer.

The active layer 243 is a region in which an electron and a hole recombine. When an electron and a hole recombine, they transition to a lower energy level and light having a corresponding wavelength may be generated. The active layer 243 may include a semiconductor material having a composition formula of $In_xAl_yGa_{1-x-y}N$ ($0 \leq x \leq 1$, $0 \leq y \leq 1$, and $0 \leq x+y \leq 1$) and have a single-quantum well structure or a multi-quantum well (MQW) structure. In addition, the active layer 243 may have a quantum wire structure or a quantum dot structure.

The light-emitting diodes LED may include a vertical-type light-emitting diode, and a first electrode pad 241 may be spaced apart from a second electrode pad 245 in a direction in which the first semiconductor layer 242, the active layer 243, and the second semiconductor layer 244 are stacked (e.g., in a thickness direction of the substrate 100). The first electrode pad 241 and the second electrode pad 245 may be respectively exposed to opposite directions. In an embodiment in which the light-emitting diode LED is a flip-type light-emitting diode, for example, in the case where a first electrode pad and a second electrode pad are exposed to the same surface, since the first and second electrode pads should be connected to electrodes for applying predetermined voltages to the first and second electrode pads, an alignment process is difficult and a width of the flip-type light-emitting diode is greater than a width of a vertical-type light-emitting diode. Therefore, the transmission area TA may be reduced. In contrast, since an alignment process of the vertical-type light-emitting diode is simple and the area of the vertical-type light-emitting diode on the first transparent electrode 210 is relatively small, the area of the transmission area TA may be increased. Therefore, the formation of the light-emitting diode LED as a vertical-type light-emitting diode may provide an increased area of the transmission area TA.

The first electrode pad 241 and the second electrode pad 245 of the light-emitting diode LED may include a metal. In an exemplary embodiment, the first electrode pad 241 and the second electrode pad 245 may include at least one compound selected from tin (Sn), silver (Ag), copper (Cu), and an alloy thereof. The first electrode pad 241 and the second electrode pad 245 may include the same material or different materials. In an exemplary embodiment, the first electrode pad 241 and the second electrode pad 245 may include an alloy having a highest content of tin (Sn) and a decreasing content in the order of silver (Ag) and copper (Cu).

The first electrode pad 241 may be electrically connected to the first transparent electrode 210, and the second electrode pad 245 may be electrically connected to the second transparent electrode 230. An adhesive layer 215 may be arranged between the first electrode pad 241 and the first transparent electrode 210. For example, as shown in the exemplary embodiment of FIG. 6, a lower surface of the adhesive layer 215 may directly contact an upper surface of the first transparent electrode 210 and an upper surface of the adhesive layer 215 may directly contact a lower surface of the first electrode pad 241. The adhesive layer 215 may overlap only the light-emitting diode LED. For example, lateral edges of the adhesive layer 215 may be coplanar with and may not extend past lateral edges of the first semiconductor layer 242, the active layer 243, the second semiconductor layer 244 and the second electrode pad 245 in a direction parallel to an upper surface of the substrate 100. The adhesive layer 215 may have an area corresponding to the light-emitting diode LED (e.g., in a plane defined by the x direction and y direction). For example, when the light-emitting diode LED is projected in a direction perpendicular to a top surface of the substrate 100, the area of the light-emitting diode LED may be substantially the same as the area of the adhesive layer 215. Here, when the area of A is referred to as being substantially the same as the area of B, a difference between the area of A and the area of B may be less than about 10% of the area of A or B. More preferably, a difference between the area of A and the area of B may be less than about 8% or about 5% of the area of A or B.

The adhesive layer 215 may include a metal. In an exemplary embodiment, the adhesive layer 215 may include at least one metal element selected from copper (Cu), silver (Ag), and gold (Au). In an exemplary embodiment, the adhesive layer 215 may include a single layer or a multi-layered structure including the above materials.

In an exemplary embodiment, the second transparent electrode 230 may include at least one of conductive oxides including indium tin oxide (ITO), indium zinc oxide (IZO), zinc oxide (ZnO), indium oxide ($In_2O_3$), indium gallium oxide (IGO), or aluminum zinc oxide (AZO). The second transparent electrode 230 may be electrically connected to the second power voltage line VSSL described above with reference to the exemplary embodiments of FIGS. 5A and 5B. The second power voltage line VSSL (see FIG. 5A or 5B) may be arranged on the same layer as the first source electrode SE1 or the first drain electrode DE1, or arranged on the same layer as the first transparent electrode 210. For electric connection between the second transparent electrode 230 and the second power voltage line VSSL, the insulating layers therebetween, for example, the organic insulating layer 209 and/or the transparent insulating layer 220 may respectively include contact holes.

As described above with reference to the exemplary embodiment of FIG. 5A, unlike the first transparent electrode 210 that is spaced apart from adjacent first transparent electrodes 210, the second transparent electrode 230 may be formed as one body to entirely cover the substrate 100. For example, the second transparent electrode 230 may be formed as one body to cover the display area DA.

A transparent insulating layer 220 may be arranged between the first transparent electrode 210 and the second transparent electrode 230 (e.g., in a thickness direction of the substrate 100). The transparent insulating layer 220 may surround a lateral side surfaces of the light-emitting diode LED and may directly contact the lateral side surfaces of the light-emitting diode LED.

The transparent insulating layer 220 may include a transparent organic material. In an exemplary embodiment, the transparent insulating layer 220 may include at least one compound selected from polymethylmethacrylate (PMMA), benzocyclobutene (BCB), polyimide, acrylate, epoxy, and polyester.

As shown in the exemplary embodiment of FIG. 6, the transmission area TA is adjacent to the emission area EA. However, in contrast with the emission area EA, the transmission area TA does not include a light-emitting diode LED.

At least one transmission area TA and at least one emission area EA may overlap the opening 209OP of the organic insulating layer 209. For example, as shown in the exemplary embodiment of FIG. 6, three transmission areas TA and two emission areas EA overlap the opening 209OP. The transmission area TA may overlap (e.g., in the thickness direction of the substrate 100) the first transparent electrode 210 and the second transparent electrode 230 and overlap the transparent insulating layer 220 between the first transparent electrode 210 and the second transparent electrode 230. For example, the transmission area TA may overlap a stacked structure in which the first transparent electrode 210, the transparent insulating layer 220, and the second transparent electrode 230 are sequentially stacked (e.g., in the thickness direction of the substrate 100). The transparent insulating layer 220 may directly contact an upper surface of the first transparent electrode 210 and a lower surface of the second transparent electrode 230 in the transmission area TA.

When viewed in a direction perpendicular to a front surface (or a main surface 100f) of the substrate 100, the transmission area TA may entirely surround the emission area EA as described above with reference to FIG. 4. In the display device 1 having the structure described with reference to the exemplary embodiments of FIG. 5A or 5B and FIG. 6, the display area may include a two-dimensional arrangement structure in which units U of FIG. 4 are repeatedly arranged. In exemplary embodiments of the present inventive concepts having the above-described structure, an area occupied by the transmission area TA in each unit U may be about 50% or more of the total area of each unit U (e.g., in a plane defined by the x direction and the y direction).

Figure 7A:
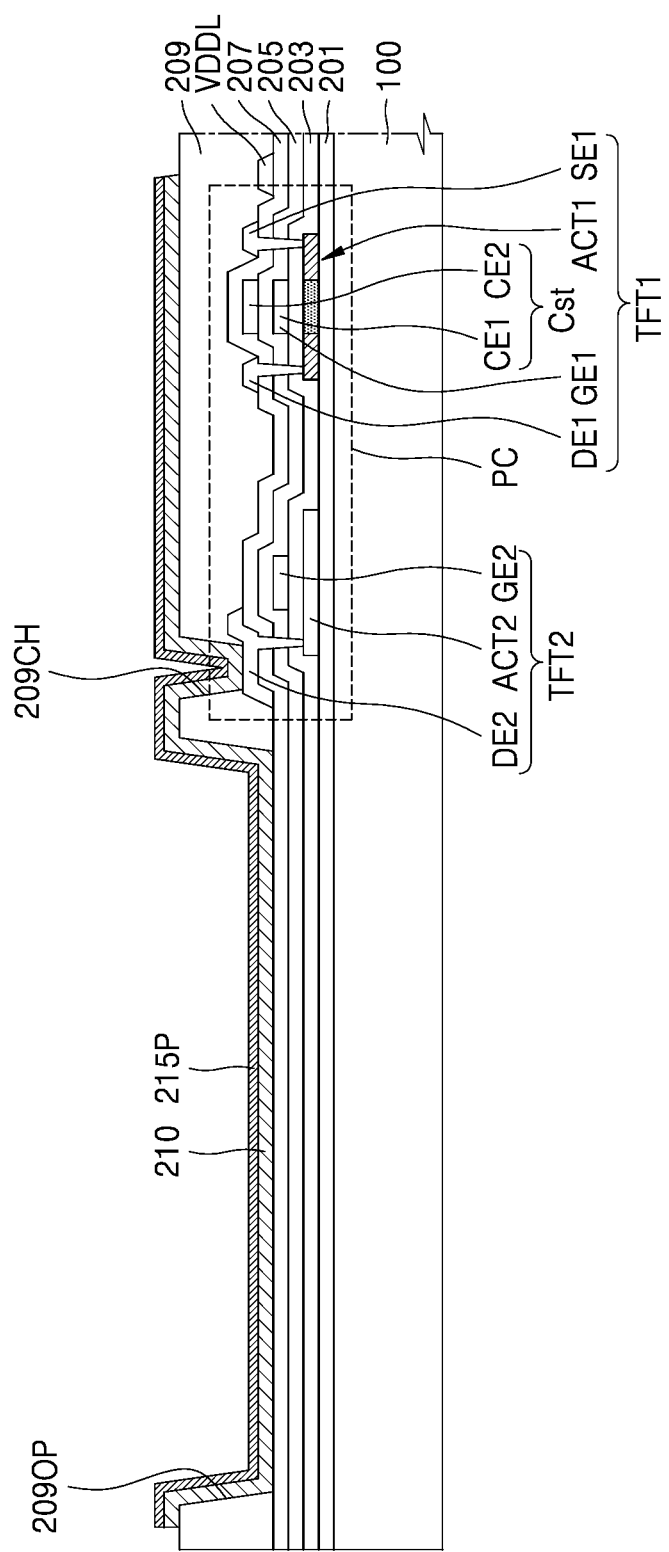
FIG. 7A is a cross-sectional view showing a process of manufacturing a display device according to an exemplary embodiment of the present inventive concepts.
Figure 7B:
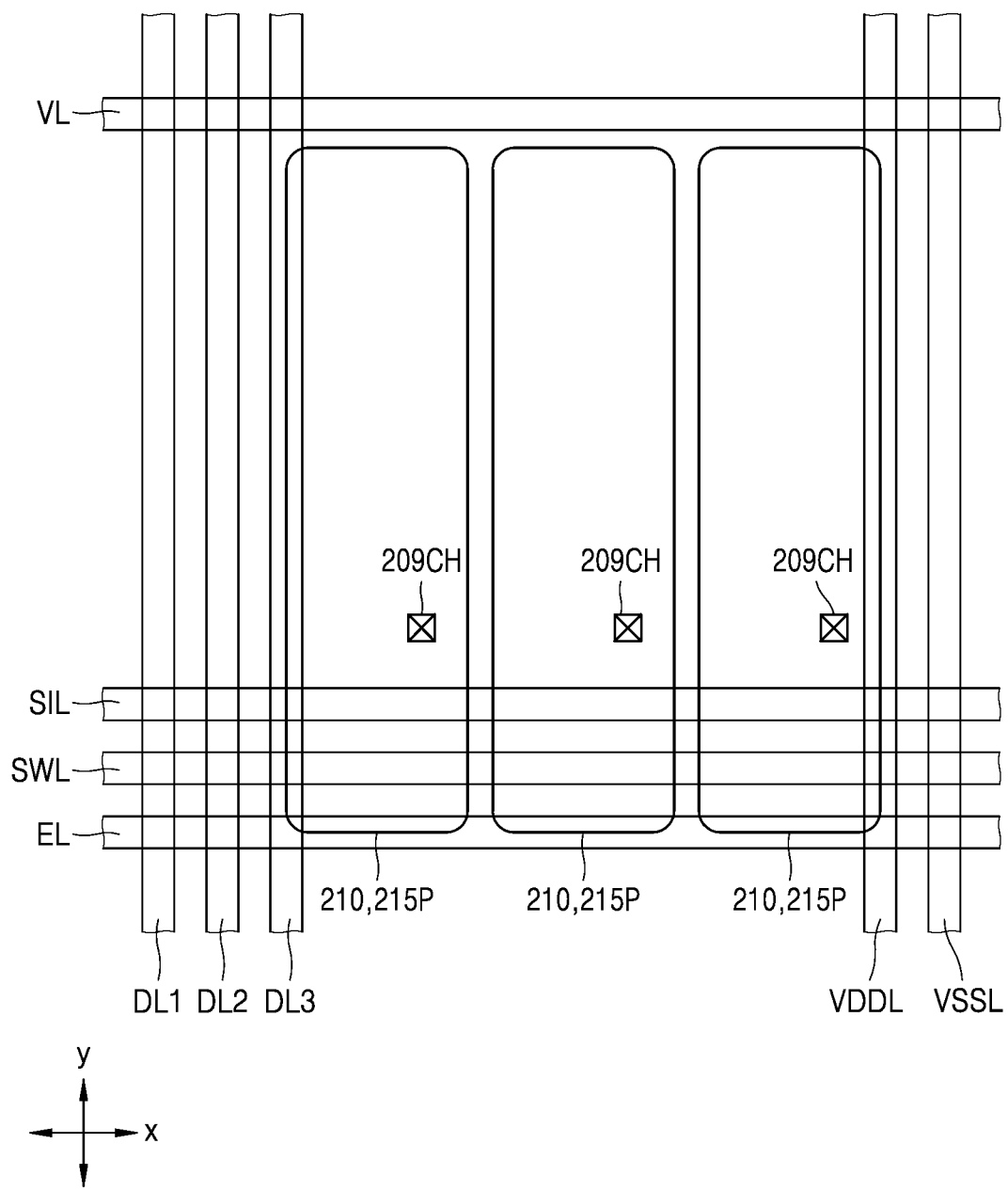
FIG. 7B is a plan view showing a process of manufacturing a display device according to an exemplary embodiment of the present inventive concepts.

FIG. 7A is a cross-sectional view showing a process of manufacturing the display device 1 according to an exemplary embodiment of the present inventive concepts. FIG. 7B is a plan view showing a process of manufacturing the display device 1 according to an exemplary embodiment of the present inventive concepts.

Referring to the exemplary embodiments of FIGS. 7A and 7B, the circuit element PC may be formed on the substrate 100, and the circuit element PC may include the first thin film transistor TFT1, the second thin film transistor TFT2, and the storage capacitor Cst as described above. The buffer layer 201, the gate insulating layer 203, the first interlayer insulating layer 205, and the second interlayer insulating layer 207 may be formed both before the circuit element PC is formed and during the formation of the circuit element PC. The buffer layer 201, the gate insulating layer 203, the first interlayer insulating layer 205, and the second interlayer insulating layer 207 may be composed of the materials described above. In an exemplary embodiment, the contact hole 209CH and the opening 209OP may be formed by forming the organic insulating layer 209 on the circuit element PC and removing a portion of the organic insulating layer 209. The opening 209OP may extend from a top surface to a bottom surface of the organic insulating layer 209.

During a process of forming the circuit element PC, signal lines and power lines may be formed. For example, the scan line SWL, the previous scan line SIL, the emission control line EL, the initialization voltage line VL, the first to third data lines DL1, DL2, and DL3, the first power voltage line VDDL, and/or the second power voltage line VSSL shown in the exemplary embodiment of FIG. 7B may be formed. In an exemplary embodiment, the scan line SWL, the previous scan line SIL, and the emission control line EL may be located on the same layer as the first gate electrode GE1 of the first thin film transistor TFT1 and may include the same material as the material of the first gate electrode GE1 of the first thin film transistor TFT1. The initialization voltage line VL may be located on the same layer as the second electrode CE2 of the storage capacitor Cst and may include the same material as the material of the second electrode CE2. The first to third data lines DL1, DL2, and DL3, the first power voltage line VDDL, and/or the second power voltage line VSSL may be located on the same layer as the first source electrode SE1 or the first drain electrode DE1 of the first thin film transistor TFT1 and may include the same material as the material of the first source electrode SE1 or the first drain electrode DE1. In an exemplary embodiment, the second power voltage line VSSL may be located on the same layer as the first transparent electrode 210 described below and may include the same material as the material of the first transparent electrode 210.

The first transparent electrode 210 may then be formed. A metal layer 215P is formed on the first transparent electrode 210. The first transparent electrode 210 may be formed by forming a transparent conductive oxide layer and then polymerizing the transparent conductive oxide layer. For example, in instances in which high temperature is applied to the transparent conductive oxide layer, the first transparent electrode 210 including a polycrystalline transparent conductive oxide layer, such as polycrystalline ITO, may be formed.

The metal layer 215P may then be formed. In an exemplary embodiment, the metal layer 215P may include at least one metal selected from copper (Cu), silver (Ag), and gold (Au). For example, the metal layer 215P may include a copper layer.

Figure 8A:
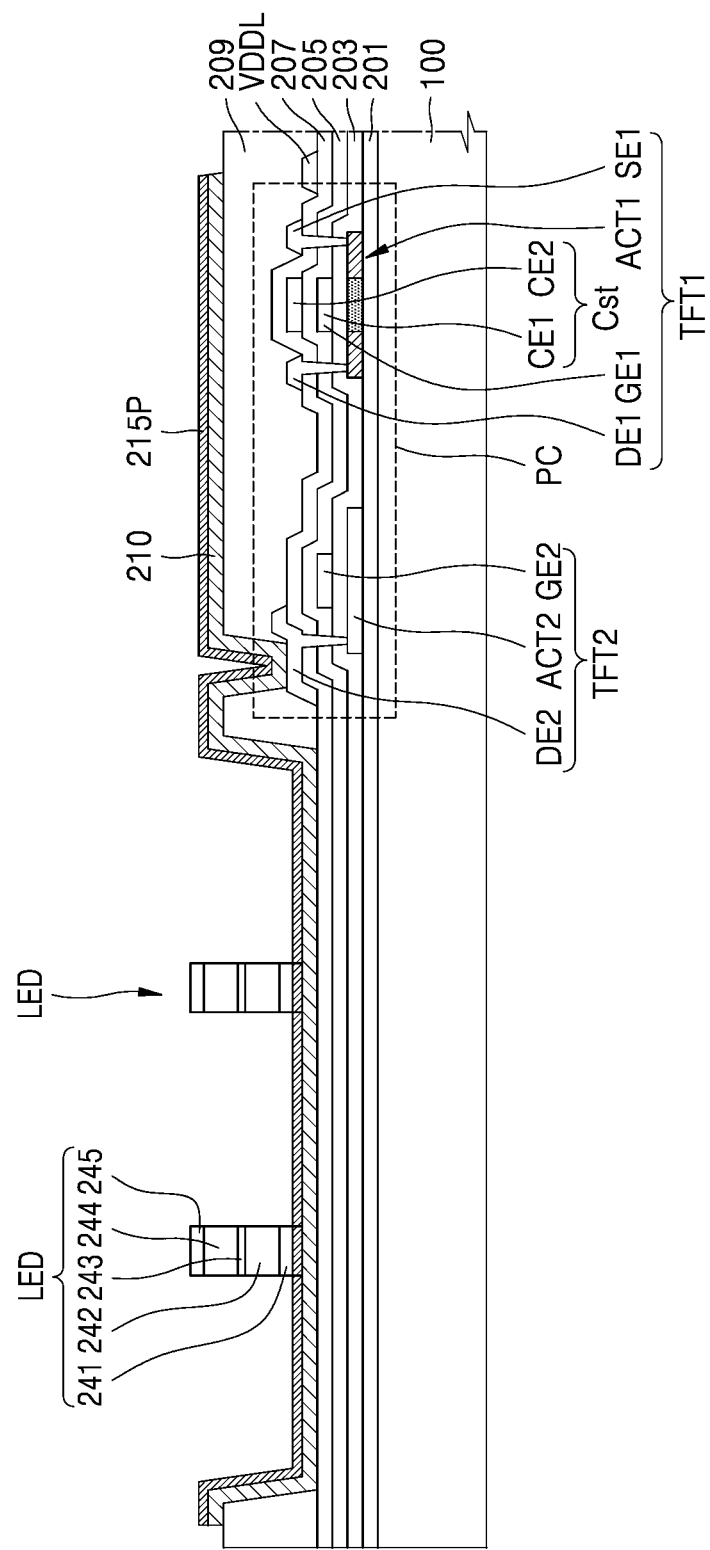
FIGS. 8A and 8B are cross-sectional views showing a process of manufacturing a display device according to an exemplary embodiment of the present inventive concepts.
Figure 8B:
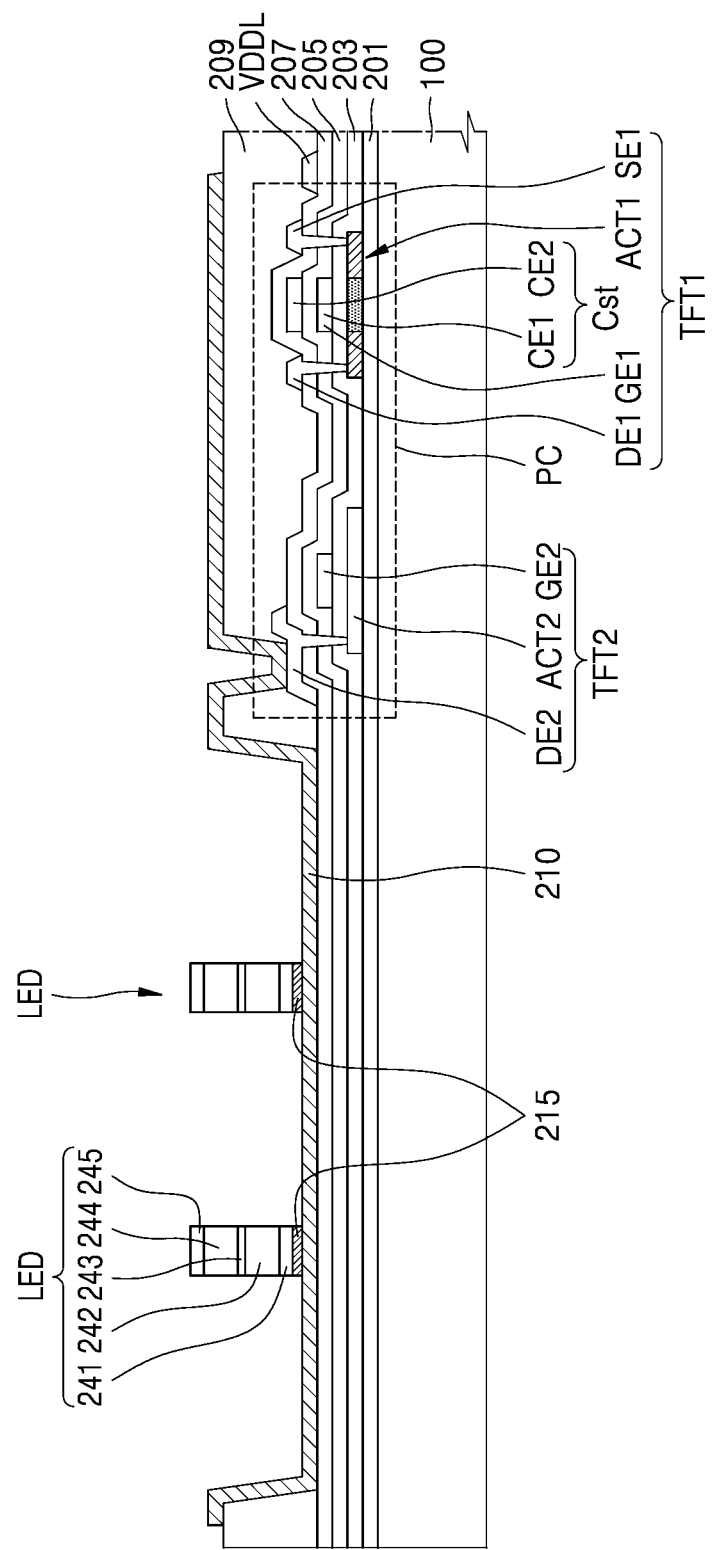
Figure 8C:
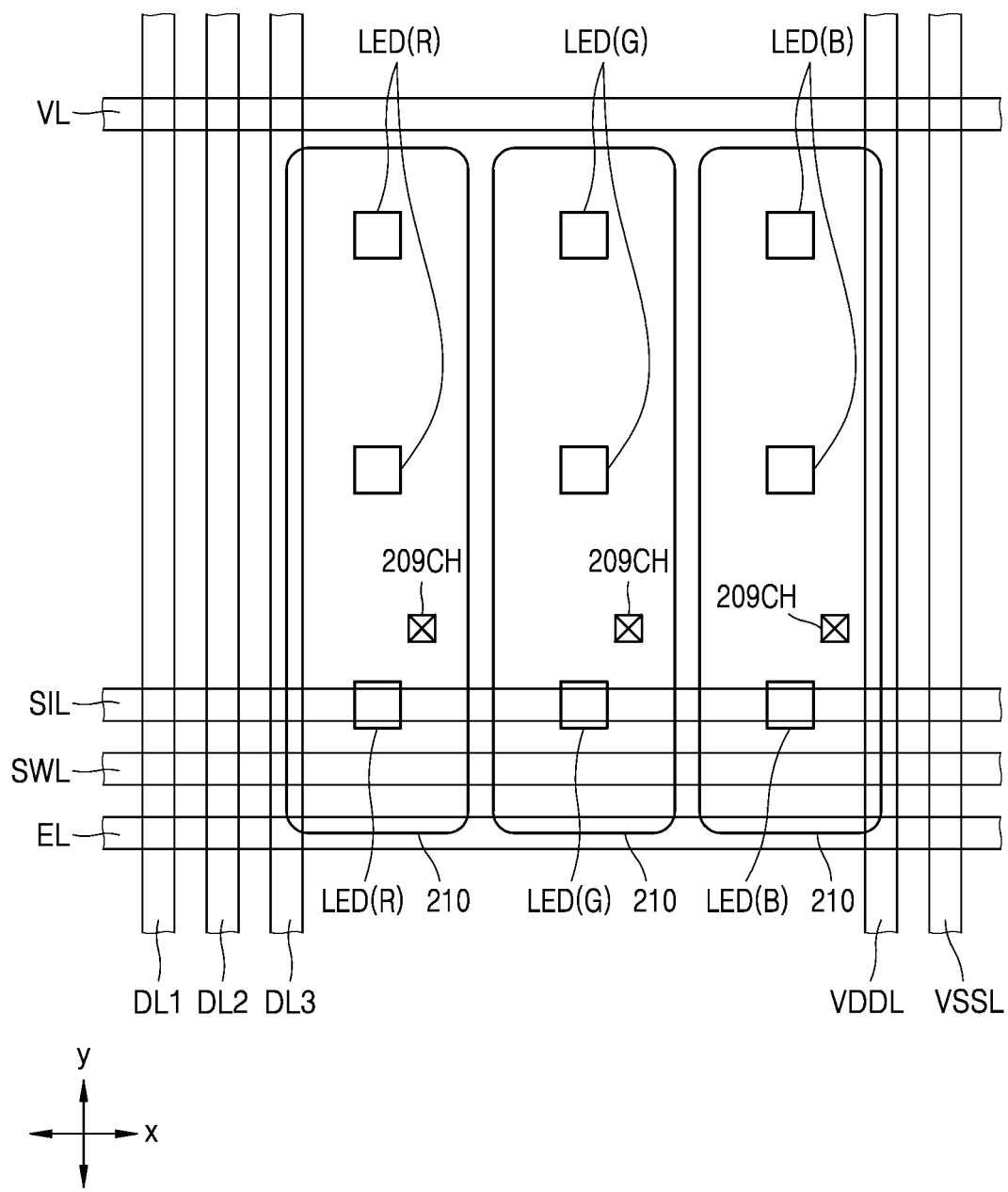
FIG. 8C is a plan view showing a process of manufacturing a display device according to an exemplary embodiment of the present inventive concepts.

FIGS. 8A and 8B are cross-sectional views showing a process of manufacturing the display device 1 according to an exemplary embodiment of the present inventive concepts. FIG. 8C is a plan view showing a process of manufacturing the display device 1 according to an exemplary embodiment of the present inventive concepts.

Referring to the exemplary embodiment of FIG. 5A, light-emitting diodes LED may be arranged on the metal layer 215P. For example, the light-emitting diodes LED may be eutectic-bonded. Since the metal layer 215P overlaps the first transparent electrode 210 (e.g., in a thickness direction of the substrate 10) and has substantially the same area as that of the first transparent electrode 210, a process of mounting the light-emitting diode LED, for example, a process of aligning the light-emitting diode LED, may be performed relatively simply and easily.

As shown in the exemplary embodiment of FIG. 8B, the metal layer 215P is then removed by using the light-emitting diode LED as a mask and the adhesive layer 215 may be formed between the light-emitting diode LED and the first transparent electrode 210 (e.g., in a thickness direction of the substrate 100). In an exemplary embodiment, the metal layer 215P may be removed through wet or dry etching. The adhesive layer 215 may be arranged only between the first transparent electrode 210 and the light-emitting diode LED through the etching process. For example, lateral edges of the adhesive layer 215 may be coplanar with and may not extend past lateral edges of the other layers of the light-emitting diode LED in a direction parallel to an upper surface of the substrate 100. Since the first transparent electrode 210 includes a polycrystalline transparent conductive material, the damage to the first transparent electrode 210 may be minimized or prevented during the etching process.

As shown in the exemplary embodiment of FIG. 8C, a plurality of light-emitting diodes LED may be arranged over each first transparent electrode 210 through the above processes. As shown in the exemplary embodiment of FIG. 8C, the light-emitting diodes LED may be arranged with the same interval over each first transparent electrode 210.

Figure 9A:
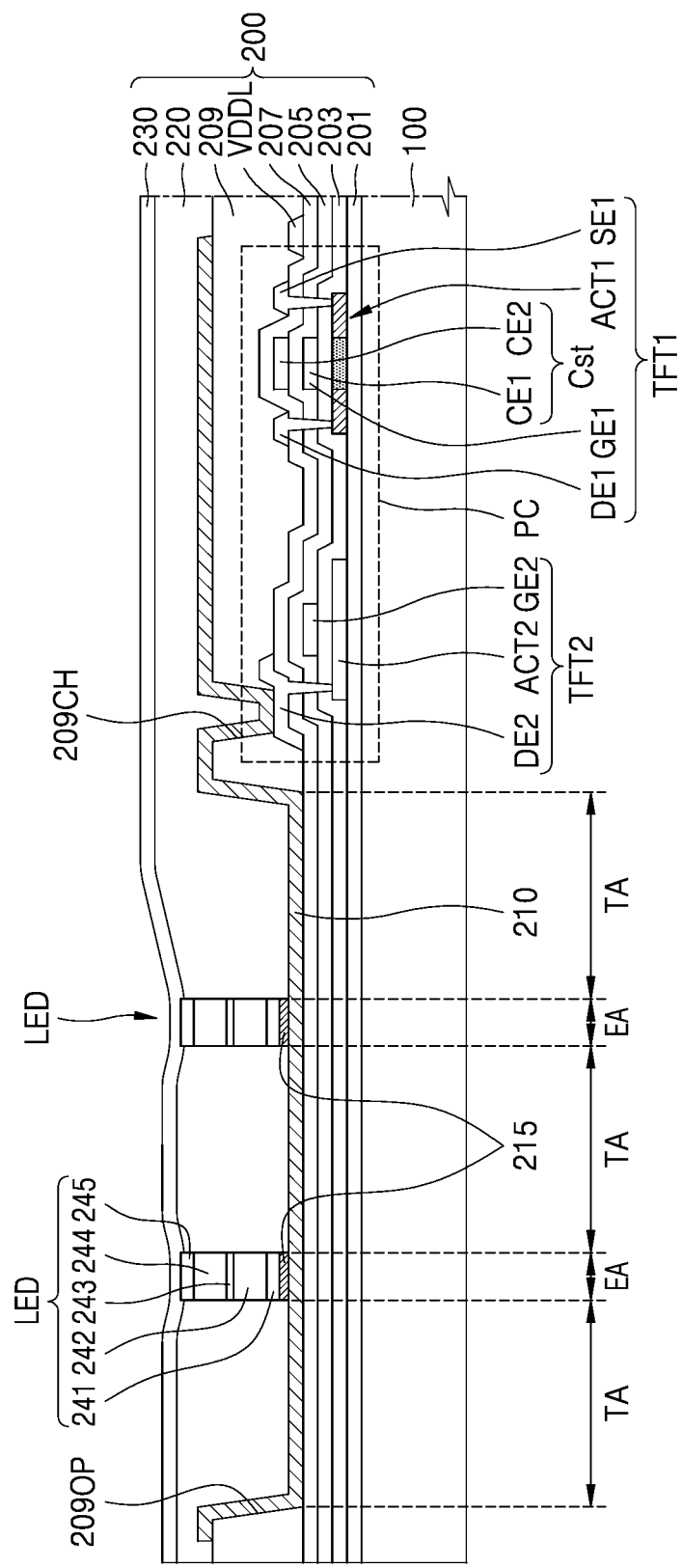
FIG. 9A is a cross-sectional view showing a process of manufacturing a display device according to an exemplary embodiment of the present inventive concepts.
Figure 9B:
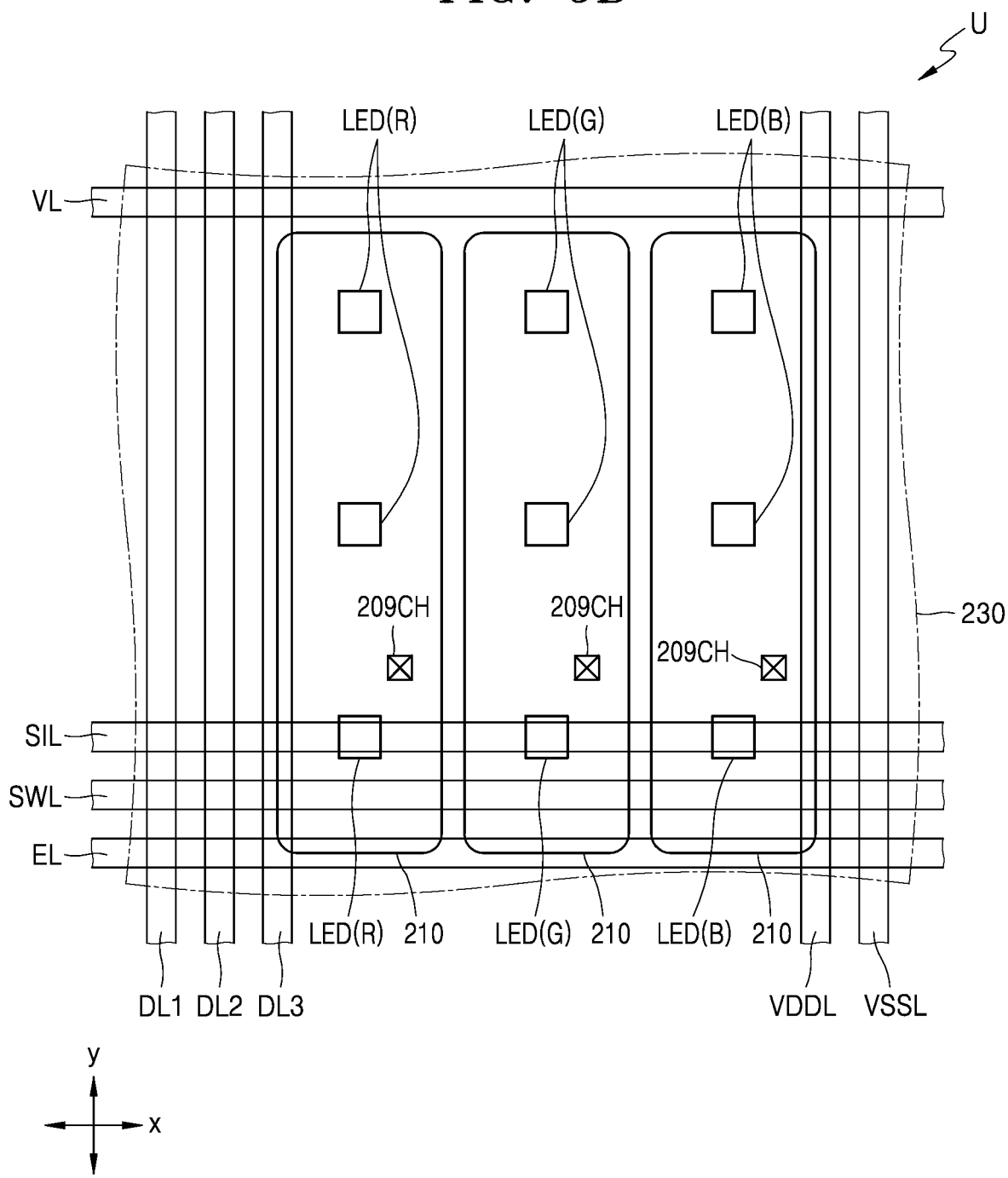
FIG. 9B is a plan view showing a process of manufacturing a display device according to an embodiment.

FIG. 9A is a cross-sectional view showing a process of manufacturing the display device 1 according to an exemplary embodiment of the present inventive concepts. FIG. 9B is a plan view showing a process of manufacturing the display device 1 according to an exemplary embodiment of the present inventive concepts.

Referring to the exemplary embodiment of FIG. 9A, after the light-emitting diodes LED are disposed on the adhesive layer 215, the transparent insulating layer 220 and the second transparent electrode 230 are sequentially formed (e.g., in a thickness direction of the substrate 100). In an exemplary embodiment, the transparent insulating layer 220 and the second transparent electrode 230 may be formed as one body to entirely cover the substrate 100. However, exemplary embodiments of the present inventive concepts are not limited thereto. For example, in another exemplary embodiment, the transparent insulating layer 220 may have an area that may overlap the three first transparent electrodes 210 shown in the exemplary embodiment of FIG. 9B and be arranged in an island type for each unit U. In this embodiment, the transparent insulating layer 220 of one unit U may be spaced apart (e.g., in the x direction) from the transparent insulating layer 220 of an adjacent unit U.

Figure 10:
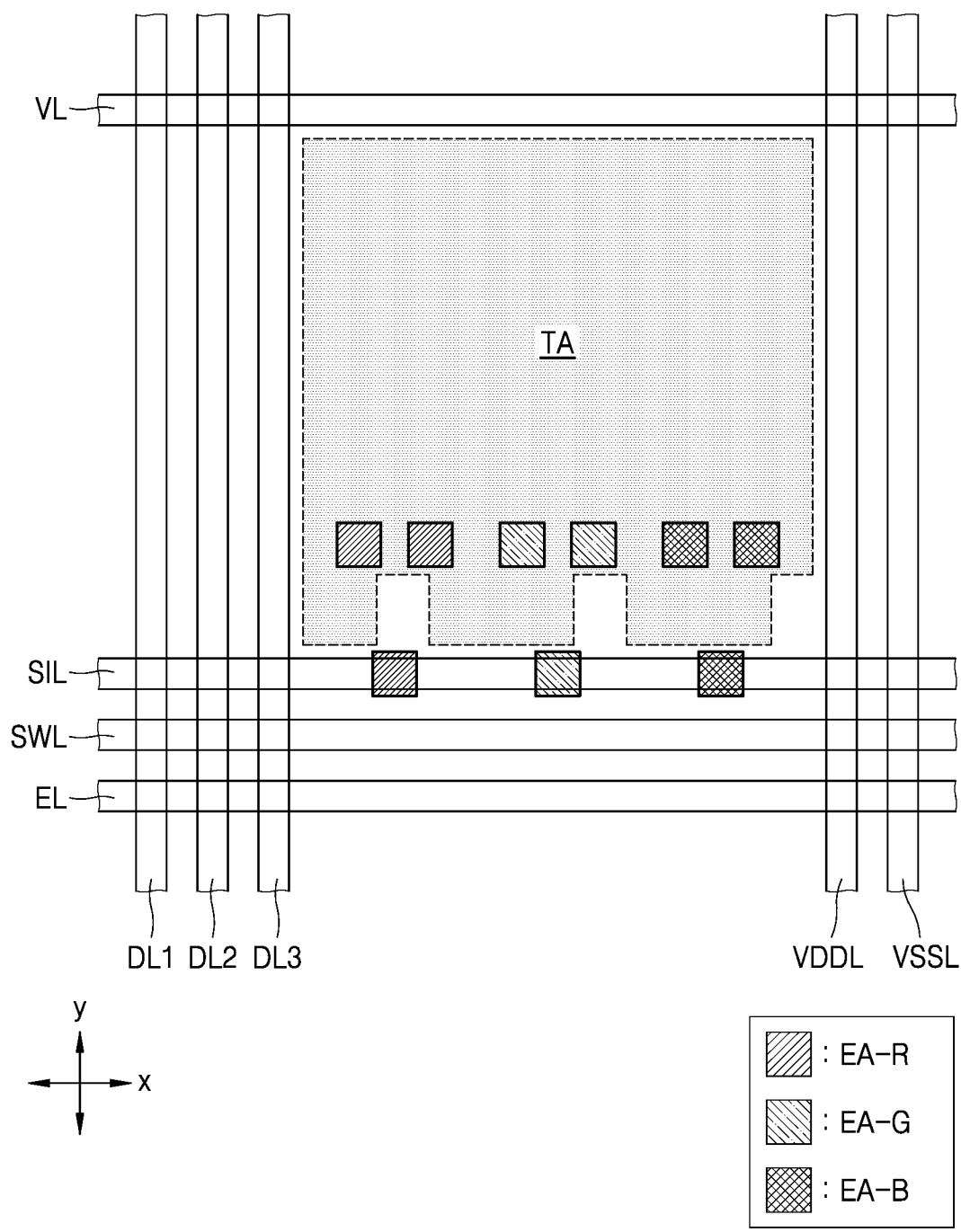
FIG. 10 is a plan view of a unit of a display device that includes emission areas and a transmission area according to an exemplary embodiment of the present inventive concepts.

FIG. 10 is a plan view of a portion of the display device 1 according to an exemplary embodiment of the present inventive concept.

Referring to the exemplary embodiment of FIG. 10, as described above with reference to FIG. 4, the unit U may include a plurality of vertical lines extending in the y direction and arranged in the x direction and a plurality of horizontal lines extending in the x direction and arranged in the y direction. As shown in the exemplary embodiment of FIG. 10, the plurality of vertical lines may include, for example, the first to third data lines DL1, DL2, and DL3, the first power voltage line VDDL, and the second power voltage line VSSL. The plurality of horizontal lines may include, for example, the scan line SWL, the previous scan line SIL, the emission control line EL, and the initialization voltage line VL. The first to third data lines DL1, DL2, and DL3 may be adjacent to each other and may be spaced apart from the first power voltage line VDDL and the second power voltage line VSSL with the transmission area TA disposed between. The scan line SWL, the previous scan line SIL and the emission control line EL may be adjacent to each other and may be spaced apart from the initialization voltage line VL with the transmission area TA disposed therebetween.

As shown above in the exemplary embodiment of FIG. 5A, in the unit U, the light-emitting diodes LED are spaced apart from each other with a predetermined interval in the y direction on the first transparent electrode 210. Therefore, as shown in the exemplary embodiment of FIG. 4, a plurality of red emission areas EA-R are arranged to have a predetermined interval in the y direction, and a plurality of green emission areas EA-G and blue emission areas EA-B are arranged to have a predetermined interval in the y direction. However, in another exemplary embodiment, as shown in FIG. 10, the emission areas may be arranged biased (offset) on a portion of the first transparent electrode 210.

As shown in the exemplary embodiment of FIG. 10, the red emission areas EA-R may be located on the first transparent electrode 210 and arranged on a lower portion of the first transparent electrode 210 (e.g., in the y direction). Similarly, the green emission areas EA-G and the blue emission areas EA-B may be respectively located on the relevant first transparent electrodes 210 and arranged on the lower portion of the first transparent electrode 210 (e.g., in they direction). For example, as shown in the exemplary embodiment of FIG. 10, the plurality of red emission areas EA-R, green emission areas EA-G and blue emission areas EA-B may each include three emission areas. Each of the plurality of red emission areas EA-R, green emission areas EA-G and blue emission areas EA-B includes a lower emission area (e.g., in the y direction) that overlaps the previous scan line SIL and is not completely surrounded by the transmission area TA. Each of the plurality of red emission areas EA-R, green emission areas EA-G and blue emission areas EA-B also includes two central emission areas that are arranged upwardly (e.g., in the y direction) with respect to the lower emission area on a lower portion of the first transparent electrode 210 and are spaced apart in the x direction from the lower emission area. The central emission areas are completely surrounded by the transmission area TA.

In the exemplary embodiment of FIG. 10, the location of the emission area EA-R, EA-G and EA-B may correspond to the location of the light-emitting diode. In the exemplary embodiment of FIG. 10, each of the red emission areas EA-R may correspond to the location of the light-emitting diode that emits red light, each of the green emission areas EA-G may correspond to the location of the light-emitting diode that emits green light, and each of the blue emission areas EA-B may correspond to the location of the light-emitting diode that emits blue light.

While the exemplary embodiment of FIG. 10 has the locations of the emission areas biased to the lower portion (e.g., in the y direction) of the first transparent electrode 210, exemplary embodiments of the present inventive concepts are not limited thereto. For example, in other exemplary embodiments the emission area and/or the light-emitting diode may be located on the upper portion or the intermediate portion of the first transparent electrode 210 and the arrangement of the plurality of emission areas may vary.

Figure 11:
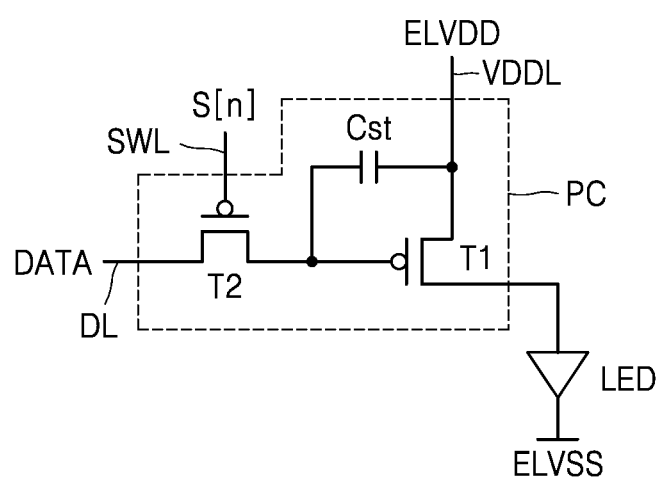
FIG. 11 is a diagram of a circuit connected to a light-emitting diode of a display device according to an exemplary embodiment of the present inventive concepts.

FIG. 11 is a diagram of a circuit connected to one of light-emitting diodes provided to the display device 1 according to an exemplary embodiment of the present inventive concepts.

Referring to the exemplary embodiment of FIG. 11, the circuit element PC connected to the light-emitting diode LED may include the first transistor T1, the second transistor T2, and the storage capacitor Cst.

The second transistor 12 is connected to the scan line SWL and the data line DL. The second transistor T2 which is a switching transistor is turned on in response to a scan signal S[n] transferred through the scan line SWL and performs a switching operation of transferring a data signal DATA transferred through the data line DL to the first electrode of the first transistor T1.

The storage capacitor Cst is connected to the second transistor T2 and the first power voltage line VDDL and stores a voltage corresponding to a difference between a voltage transferred from the second transistor T2 and the first power voltage ELVDD supplied to the first power voltage line VDDL.

The first transistor T1 is connected to the first power voltage line VDDL and the storage capacitor Cst and may control a driving current flowing through the light-emitting diode LED from the first power voltage line VDDL to a line of a second power voltage ELVSS in response to the voltage stored in the storage capacitor Cst. The light-emitting diode LED may emit light having a predetermined brightness by using the driving current.

While the circuit element PC in the exemplary embodiment of FIG. 11 includes two transistors and one storage capacitor, the number of transistors and the number of storage capacitors may be variously changed in other exemplary embodiments.

Figure 12:
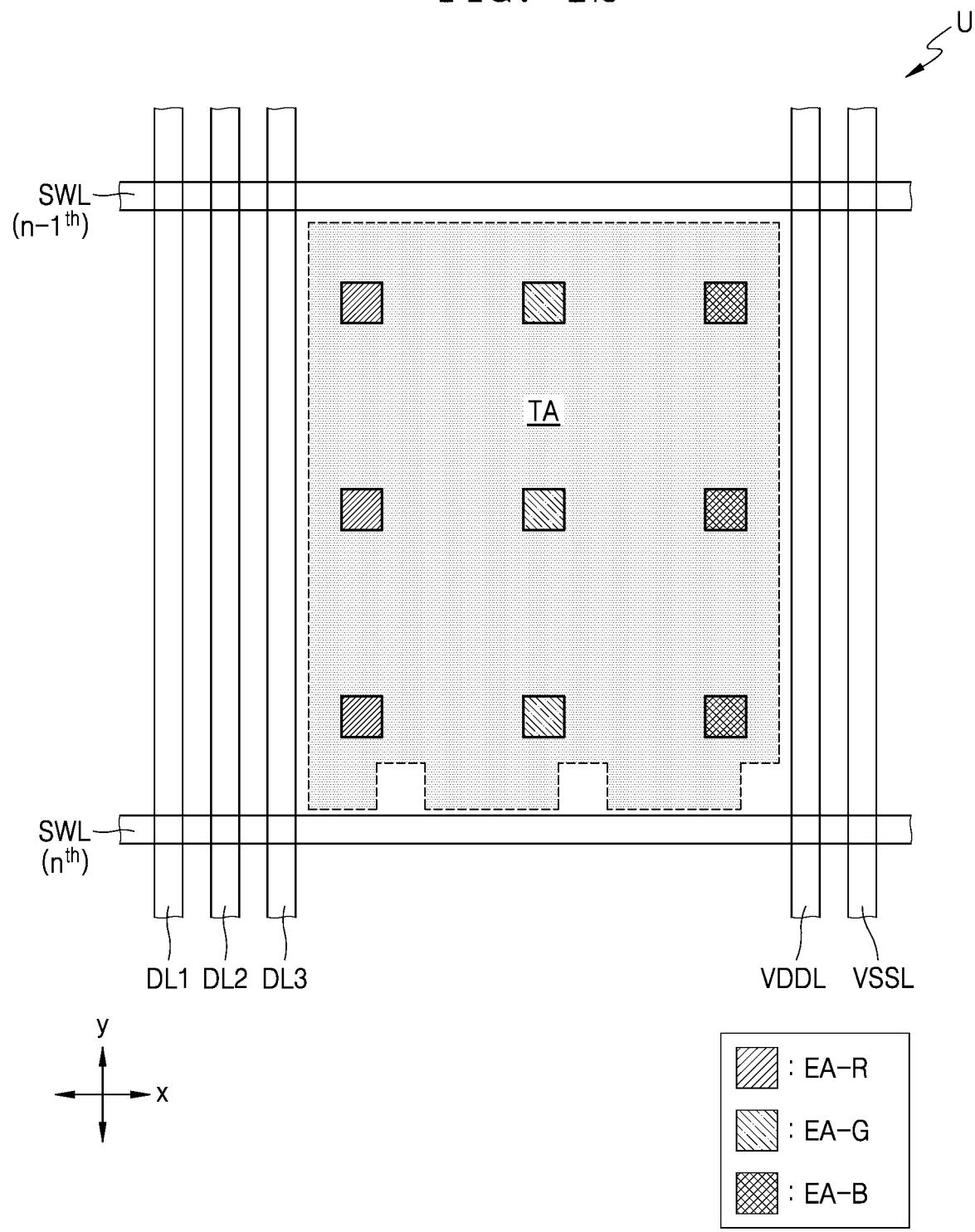
FIG. 12 is a plan view of a unit of a display device that includes an emission area and a transmission area according to an exemplary embodiment of the present inventive concepts.

FIG. 12 is a plan view of one unit U including the emission area EA-R, EA-G and EA-B and the transmission area TA, as a portion of the display device 1 according to an exemplary embodiment of the present inventive concepts.

Referring to the exemplary embodiment of FIG. 12, a plurality of lines may extend in the y direction and are arranged in the x direction and a plurality of lines may extend in the x direction and are arranged in the y direction. As shown in the exemplary embodiment of FIG. 12, the first data line DL1, the second data line DL2, the third data line DL3, the first power voltage line VDDL, and the second power voltage line VSSL may extend in the y direction and may be arranged in the x direction. The scan line SWL may extend in the x direction and is arranged in the y direction. In the exemplary embodiment of FIG. 12, a scan line SWL (n–1)th corresponding to an (n–1)-th pixel column, and a scan line SWL (n)-th corresponding to an n-th pixel column are adjacent to each other and are spaced apart from each other in the y direction.

The transmission area TA may be defined between adjacent lines among the lines extending in the y direction and between adjacent lines among the lines extending in the x direction. For example, as shown in the exemplary embodiment of FIG. 12, the transmission area TA may be disposed between the third data line DL3 and the first power voltage line VDDL and between the two scan lines SWL (n–1)-th and SWL (n)-th.

The transmission area TA is a region that does not overlap the lines, a circuit element connected to the lines, and the emission areas described below. The transmission area TA is a region through which external light may pass. The emission area may be adjacent to the transmission area TA. For example, the red emission area EA-R, the green emission area EA-G, and the blue emission area EA-B may be adjacent to the transmission area TA. As shown in the exemplary embodiment of FIG. 12, each of the plurality of red emission areas EA-R, green emission areas EA-G and blue emission areas EA-B may include three emission areas which are spaced apart from each other in the y direction at regular intervals. Each of the plurality of red emission areas EA-R, green emission areas EA-G and blue emission areas EA-B may be completely surrounded by the transmission area TA in a plan view (e.g., in a plane defined by the x direction and the y direction). However, exemplary embodiments of the present inventive concepts are not limited thereto.

Figure 13:
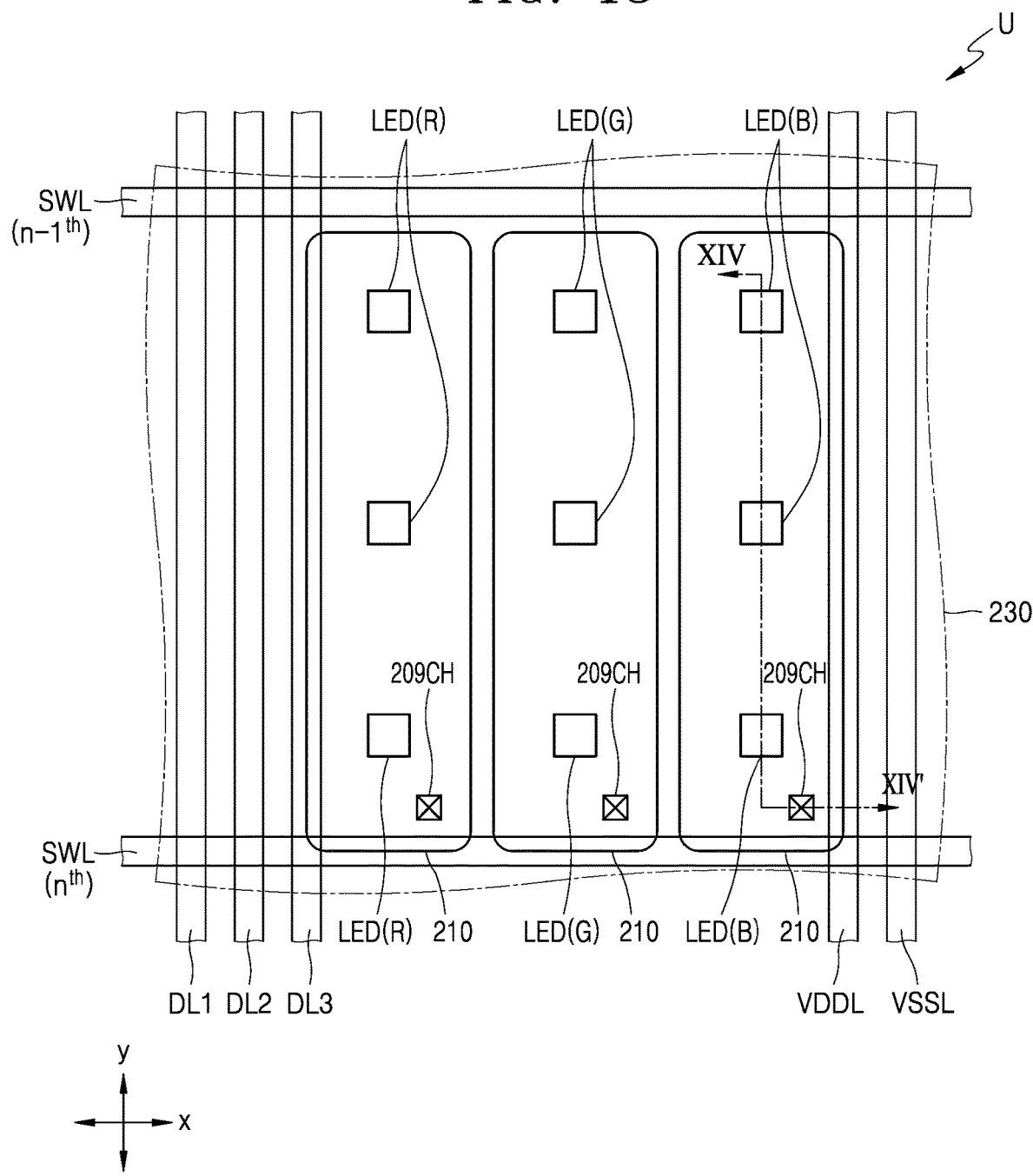
FIG. 13 is a plan view of a unit of a display device that includes a light-emitting diode and electrodes according to an exemplary embodiment of the present inventive concepts.

FIG. 13 is a plan view of locations of a light-emitting diode LED and electrodes 210 and 230 arranged in one unit U, as a portion of the display device 1 according to an exemplary embodiment of the present inventive concepts.

Referring to the exemplary embodiment of FIG. 13, at least one first transparent electrode 210 may be arranged between the lines extending in they direction. For example, as shown in the exemplary embodiment of FIG. 14, three first transparent electrodes 210 are disposed between the third data line DL3 and the first power voltage line VDDL. The three first transparent electrodes 210 are adjacent to each other, and include a central one of the first transparent electrodes 210 that is disposed between the third data line DL3 and the first power voltage line VDDL and does not overlap any lines extending in the y direction, a left one of the first transparent electrodes 210 that overlaps the third data line DL3, and a right one of the first transparent electrodes 210 that overlaps the first power voltage line VDDL.

At least one light-emitting diode LED may be arranged over the first transparent electrode 210. For example, as shown in the exemplary embodiment of FIG. 13, three light-emitting diodes LED may be arranged for each first transparent electrode 210. The three light-emitting diodes LED disposed on each first transparent electrode 210 may be spaced apart in the y direction at regular intervals. However, exemplary embodiments of the present inventive concepts are not limited thereto.

Each light-emitting diode LED may emit red, green, or blue light. Red light-emitting diodes LED(R), green light-emitting diodes LED(G), and blue light-emitting diodes LED(B) may be arranged for each first transparent electrode 210. The light-emitting diodes LED may include a PN diode including inorganic material semiconductor-based materials. A specific material and a size thereof are the same as those described above.

Some of the first to third data lines DL1, DL2, and DL3 shown in the exemplary embodiment of FIG. 13 may be electrically connected to the first transparent electrode 210 through the data connection line DL-C as described above with reference to the exemplary embodiment of FIG. 5A and the data connection line DL-C may transfer a data signal to a transistor electrically connected to the relevant data line.

Referring to the exemplary embodiments of FIGS. 12 and 13, though the first to third data lines DL1, DL2, and DL3 are arranged on one side of the transmission area TA or the plurality of first transparent electrodes 210 (e.g., arranged on the left side in the x direction), exemplary embodiments of the present inventive concepts are not limited thereto. For example, in another exemplary embodiment, the first to third data lines DL1, DL2, DL3 may be spaced apart from each other (e.g., in the x direction) with the first transparent electrode 210 therebetween as described with reference to the exemplary embodiment of FIG. 5B.

Figure 14:
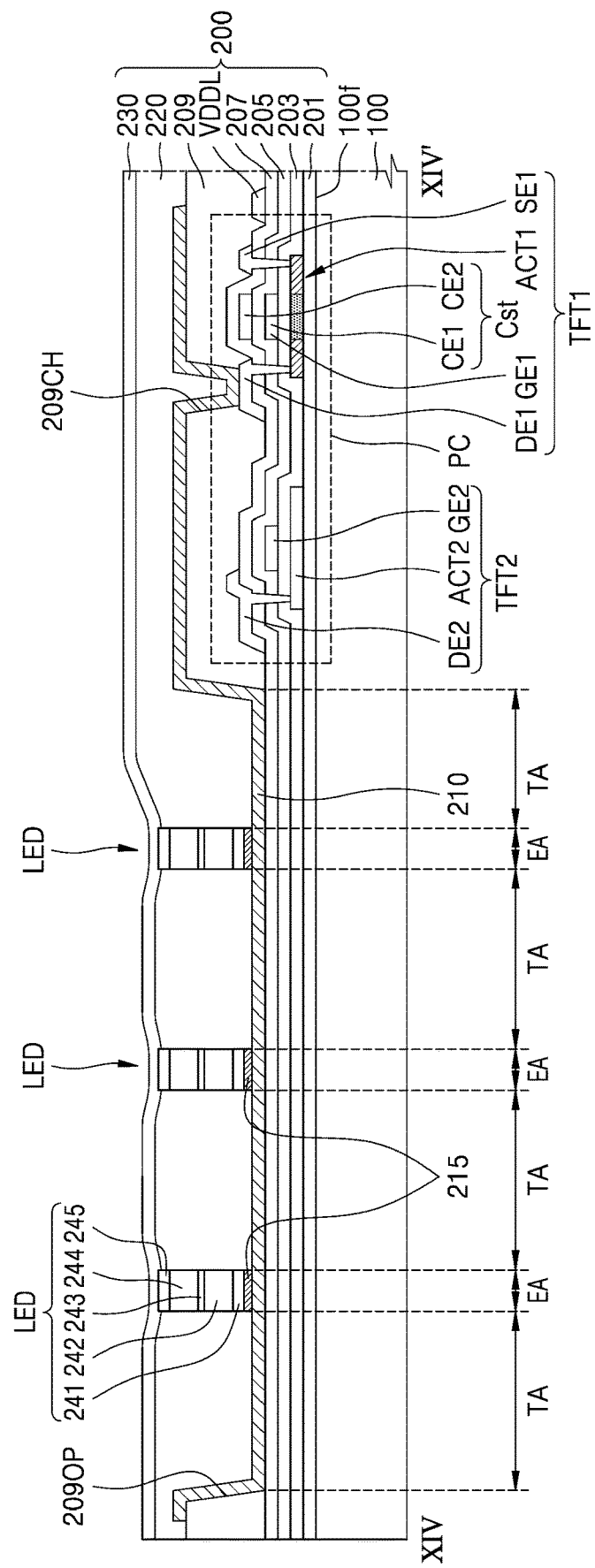
FIG. 14 is a cross-sectional view of the display device taken along line XIV-XIV' of FIG. 13 according to an exemplary embodiment of the present inventive concepts.

FIG. 14 is a cross-sectional view of the display device 1 taken along line XV-XIV' of FIG. 13 according to an exemplary embodiment of the present inventive concepts.

Referring to FIG. 14, the display layer 200 is arranged on the substrate 100, and a specific structure of the display layer 200 is substantially the same as the structure described above with reference to the exemplary embodiment of FIG. 6.

The display layer 200 may include the light-emitting diodes LED disposed between the first transparent electrode 210 and the second transparent electrode 230 (e.g., in a thickness direction of the substrate 100). The light-emitting diode LED may have a stacked structure in which the first semiconductor layer 242, the active layer 243, and the second semiconductor layer 244 are arranged between the first electrode pad 241 and the second electrode pad 245 (e.g., in a thickness direction of the substrate 100).

Each light-emitting diode LED is electrically connected to the circuit element PC including the transistors. The display layer 200 may include the circuit element PC including the first and second thin film transistors TFT1 and TFT2 and the storage capacitor Cst. In an exemplary embodiment, the first thin film transistor TFT1 of the exemplary embodiment of FIG. 14 may correspond to the first transistor T1 described with reference to FIG. 11, and the second thin film transistor TFT2 of the exemplary embodiment of FIG. 14 may correspond to the second transistor T2 described with reference to FIG. 11. In embodiments in which the number of thin film transistors and the number of storage capacitors included in the circuit element PC are relatively small, the area of the transmission area TA may be relatively and advantageously increased.

The first transparent electrode 210 is arranged on the organic insulating layer 209, and a portion (e.g. a majority) of the first transparent electrode 210 may be located in the opening 209OP of the organic insulating layer 209. The first transparent electrode 210 may be connected to the circuit element PC, for example, the first thin film transistor TFT through the contact hole 209CH formed in the organic insulating layer 209. For example, as shown in the exemplary embodiment of FIG. 14, the first transparent electrode 210 may directly contact the first drain electrode DE1 of the first thin film transistor TFT1.

In an exemplary embodiment, the transparent insulating layer 220 may include a transparent organic material. The transparent insulating layer 220 may surround each light-emitting diode LED on the first transparent electrode 210. As shown in the exemplary embodiment of FIG. 14, a portion of the transparent insulating layer 220 is disposed between the light-emitting diodes LED in a cross-sectional view.

Since the specific structures and materials of the first transparent electrode 210, the transparent insulating layer 220, and the second transparent electrode 230 are the same as those described above, descriptions thereof are omitted for convenience of explanation.

According to exemplary embodiments of the present inventive concepts, the display device may include a relatively large area for the transmission area TA and a manufacturing method thereof may be provided. These advantages are provided as an example and the scope of exemplary embodiments of the present inventive concepts are not limited thereto.

It should be understood that the exemplary embodiments of the present inventive concepts described herein should be considered in a descriptive sense only and not for purposes of limitation. Descriptions of features or aspects within each exemplary embodiment should typically be considered as available for other similar features or aspects in other exemplary embodiments. While one or more exemplary embodiments have been described with reference to the figures, it will be understood by those of ordinary skill in the art that various changes in form and details may be made therein without departing from the spirit and scope as defined by the following claims.

What is claimed is:

1. A display device including at least one emission area emitting light and a transmission area adjacent to the at least one emission area, an entirety of the transmission area does not emit light and transmits external light, the display device comprising:
    a substrate;
    a circuit element including at least one transistor and a storage capacitor disposed on the substrate;
    an insulating layer disposed on the circuit element and including a contact hole;
    a first transparent electrode disposed on the insulating layer and electrically connected to the circuit element through the contact hole; and
    at least one light-emitting diode disposed on the first transparent electrode and defining the at least one emission area, the at least one light-emitting diode comprising a PN diode including inorganic semiconductor based-materials,
    wherein a portion of the first transparent electrode is located in the transmission area.

2. The display device of claim 1, further comprising:
    a second transparent electrode disposed on the at least one light-emitting diode and facing the first transparent electrode,
    wherein the first transparent electrode overlaps the second transparent electrode in the transmission area in a direction of a thickness of the substrate.

3. The display device of claim 2, further comprising:
    a transparent insulating layer disposed between the first transparent electrode and the second transparent electrode,
    wherein the transparent insulating layer directly contacts the first transparent electrode and the second transparent electrode in the transmission area.

4. The display device of claim 1, wherein:
    the insulating layer includes an opening that is spaced apart from the contact hole and extends from a top surface to a bottom surface of the insulating layer; and
    at least a portion of the opening is located in the transmission area.

5. The display device of claim 4, further comprising:
    an inorganic insulating layer disposed between the substrate and the insulating layer,
        wherein the first transparent electrode directly contacts the inorganic insulating layer in the opening.

6. The display device of claim 1, wherein:
    the transmission area surrounds the at least one emission area when viewed in a plan view of a plane defined by a first direction and a second direction that are parallel to an upper surface of the substrate, the first direction crossing the second direction.

7. The display device of claim 1, wherein the at least one light-emitting diode includes a vertical-type light-emitting diode.

8. The display device of claim 7, wherein:
    the at least one light-emitting diode includes a first electrode pad electrically connected to the first transparent electrode and a second electrode pad facing a direction opposite to the first electrode pad and spaced apart from the first electrode pad in a direction of a thickness of the substrate,
    wherein the display device further includes an adhesive layer including a metal and disposed between the first transparent electrode and the first electrode pad in the direction of the thickness of the substrate.

9. The display device of claim 8, wherein lateral edges of the adhesive layer are co-planar with lateral edges of the at least one light-emitting diode.

10. The display device of claim 1, wherein the first transparent electrode includes a polycrystalline transparent conductive oxide.

11. A display device including a plurality of emission areas each emitting light and a transmission area adjacent to each of the plurality of emission areas, an entirety of the transmission area does not emit light and transmits external light, the display device comprising:
    a substrate;
    a transistor disposed on the substrate;
    an insulating layer disposed on the transistor and including a contact hole and an opening that are spaced apart from each other;
    a first transparent electrode disposed on the insulating layer and electrically connected to the transistor through the contact hole;
    at least two light-emitting diodes disposed on the first transparent electrode, each of the at least two light-emitting diodes including a PN diode including inorganic semiconductor based-materials, and each of the at least two light-emitting diodes defining one emission area of the plurality of emission areas, respectively; and
    a second transparent electrode disposed on the at least two light-emitting diodes and electrically connected to the at least two light-emitting diodes,
    wherein a portion of the first transparent electrode overlaps the opening of the insulating layer in the transmission area in a direction of a thickness of the substrate.

12. The display device of claim 11, further comprising:
    a transparent insulating layer between the first transparent electrode and the second transparent electrode,
    wherein the transparent insulating layer directly contacts the first transparent electrode and the second transparent electrode in the transmission area.

13. The display device of claim 11, wherein at least one of the plurality of emission areas are surrounded by the transmission area.

14. The display device of claim 11, wherein the first transparent electrode includes a polycrystalline transparent conductive oxide.

15. The display device of claim 14, further comprising:
    an adhesive layer disposed between each of the at least two light-emitting diodes and the first transparent electrode in the direction of the thickness of the substrate,
        wherein the adhesive layer includes at least one metal element selected from copper, silver, and gold.

16. A method of manufacturing a display device including at least one emission area emitting light and a transmission area adjacent to the at least one emission area that does not emit light and transmits external light, the method comprising:
    forming a transistor on a substrate;
    forming an insulating layer including an opening on the transistor;
    forming a first transparent electrode on the insulating layer, the first transparent electrode is electrically connected to the transistor and overlaps the opening of the insulating layer, wherein a portion of the first transparent electrode is located in the transmission area;
    forming a light-emitting diode on the first transparent electrode, the light-emitting diode including a PN diode; and forming a second transparent electrode on the light-emitting diode.

17. The method of claim 16, further comprising:
forming a metal layer on the first transparent electrode; and
the light-emitting diode is formed on the first transparent electrode to directly contact the metal layer.

18. The method of claim 17, further comprising removing a portion of the metal layer that does not overlap the light-emitting diode in a thickness direction of the substrate by using the light-emitting diode as a mask.

19. The method of claim 16, wherein the first transparent electrode includes a polycrystalline transparent conductive oxide.

20. The method of claim 16, wherein the first transparent electrode overlaps the second transparent electrode in the transmission area in a direction of a thickness of the substrate.

21. The method of claim 20, further comprising forming a transparent insulating layer between the first transparent electrode and the second transparent electrode.

22. A display device including a plurality of units disposed in a display area, each unit including:
a plurality of transparent electrodes that are spaced apart from each other;
a first plurality of lines extending in a first direction parallel to an upper surface of a substrate of the display device and arranged in a second direction that is parallel to the upper surface of the substrate and crosses the first direction;
a second plurality of lines extending in the second direction and arranged in the first direction;
a transmission area disposed between adjacent lines of the first plurality of lines and adjacent lines of the second plurality of lines, an entirety of the transmission area is configured to transmit external light and does not emit light; and
a plurality of emission areas adjacent to the transmission area, each emission area including a light-emitting diode that emits light,
wherein a plurality of the light emitting diodes are disposed on each of the plurality of transparent electrodes, and
wherein a portion of each of the plurality of transparent electrodes are located in the transmission area.

23. The display device of claim 22, wherein an area occupied by the transmission area in each unit of the plurality of units in a first plane defined by the first direction and the second direction is at least about 50% or more of a total area of the unit in the first plane.

* * * * *